United States Patent
Mori et al.

(10) Patent No.: US 10,134,819 B2
(45) Date of Patent: Nov. 20, 2018

(54) DISPLAY DEVICE AND ELECTRONIC APPARATUS

(71) Applicant: JOLED INC., Tokyo (JP)

(72) Inventors: Tsutomu Mori, Tokyo (JP); Yasuhiro Tanaka, Tokyo (JP); Hiroshi Sagawa, Kanagawa (JP)

(73) Assignee: Joled Inc., Tokyo (JP)

( * ) Notice: Subject to any disclaimer, the term of this patent is extended or adjusted under 35 U.S.C. 154(b) by 112 days.

(21) Appl. No.: 14/907,473

(22) PCT Filed: Sep. 2, 2014

(86) PCT No.: PCT/JP2014/073014
§ 371 (c)(1),
(2) Date: Jan. 25, 2016

(87) PCT Pub. No.: WO2015/041040
PCT Pub. Date: Mar. 26, 2015

(65) Prior Publication Data
US 2016/0181335 A1    Jun. 23, 2016

(30) Foreign Application Priority Data

Sep. 20, 2013 (JP) .................... 2013-195769

(51) Int. Cl.
*H01L 27/32*    (2006.01)
*H01L 51/00*    (2006.01)
*H01L 51/50*    (2006.01)

(52) U.S. Cl.
CPC ...... *H01L 27/3246* (2013.01); *H01L 51/0004* (2013.01); *H01L 51/0012* (2013.01); *H01L 51/5012* (2013.01)

(58) Field of Classification Search
None
See application file for complete search history.

(56) References Cited

U.S. PATENT DOCUMENTS

| | | |
|---|---|---|
| 2004/0140759 A1 | 7/2004 | Park et al. |
| 2005/0023964 A1 | 2/2005 | Omura et al. |

(Continued)

FOREIGN PATENT DOCUMENTS

| | | |
|---|---|---|
| JP | 2004335267 | 11/2004 |
| JP | 2004361907 | 12/2004 |
| JP | 2007-115563 | 5/2007 |

(Continued)

OTHER PUBLICATIONS

International Search Report issued in PCT/JP2014/073014, dated Oct. 7, 2014 (4 pages).

(Continued)

*Primary Examiner* — Ashok Patel
(74) *Attorney, Agent, or Firm* — K&L Gates LLP

(57) ABSTRACT

There is provided a display device including: a pixel region that includes a plurality of pixels arranged in a matrix; and a peripheral region outside of the pixel region. The pixel region includes first liquid-repellent parts in inter-column regions between the plurality of pixels. The peripheral region includes second liquid-repellent parts that are continuous with the first liquid-repellent parts.

15 Claims, 25 Drawing Sheets

(56) References Cited

U.S. PATENT DOCUMENTS

2012/0313509 A1* 12/2012 Takagi .................. H05B 33/10
                                                              313/504
2015/0255743 A1*  9/2015 Mori ................... H01L 27/3276
                                                              257/40

FOREIGN PATENT DOCUMENTS

| JP | 2009283285 | 12/2009 |
| JP | 2010-140790 | 6/2010 |
| JP | 2010263054 | 11/2010 |
| JP | 2012256587 | 12/2012 |
| WO | 2010/137355 | 12/2010 |

OTHER PUBLICATIONS

Japanese Office Action dated Jul. 18, 2017, in corresponding Japanese Application No. 2015-537628.

* cited by examiner

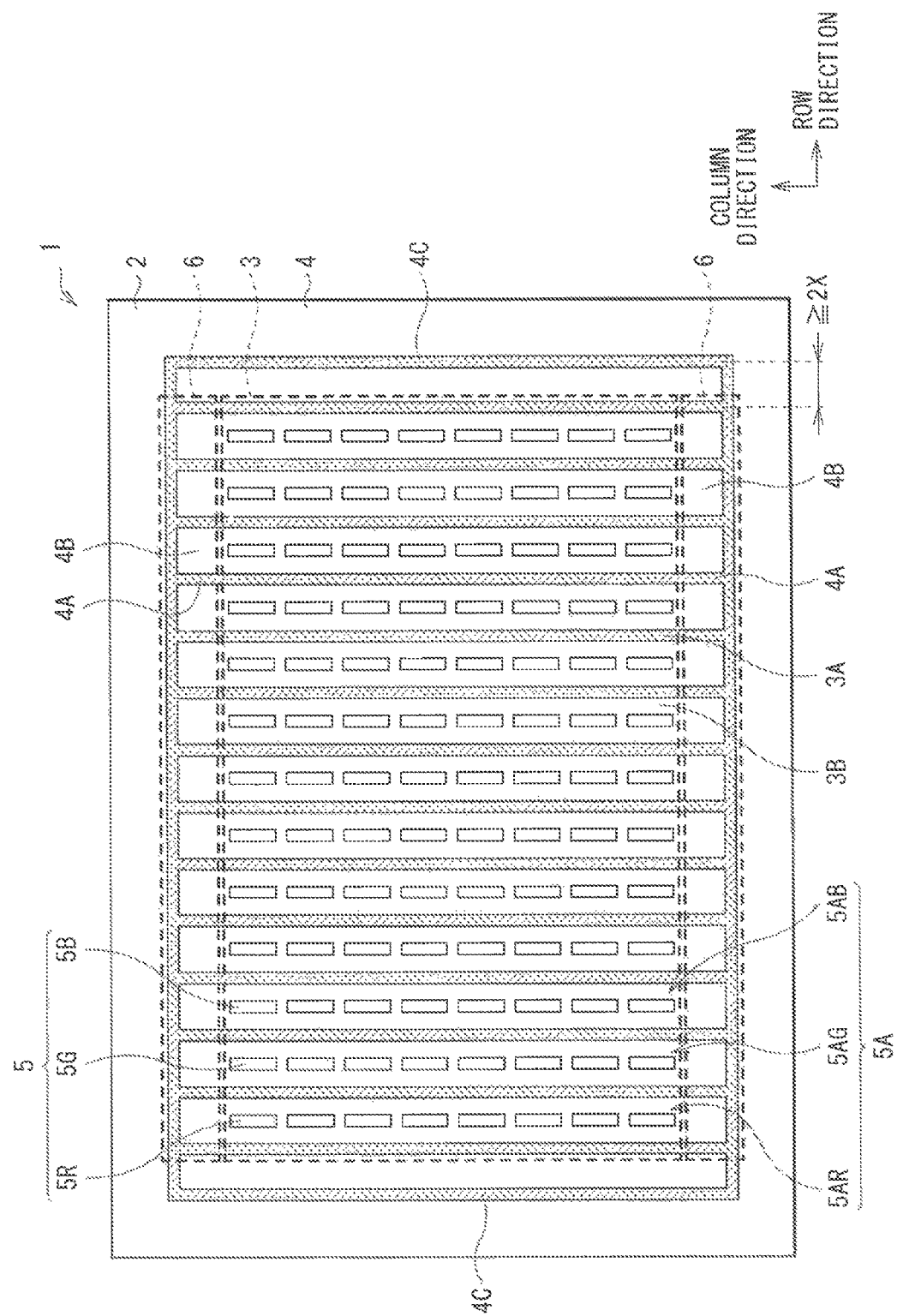
[FIG. 1]

[FIG. 2]
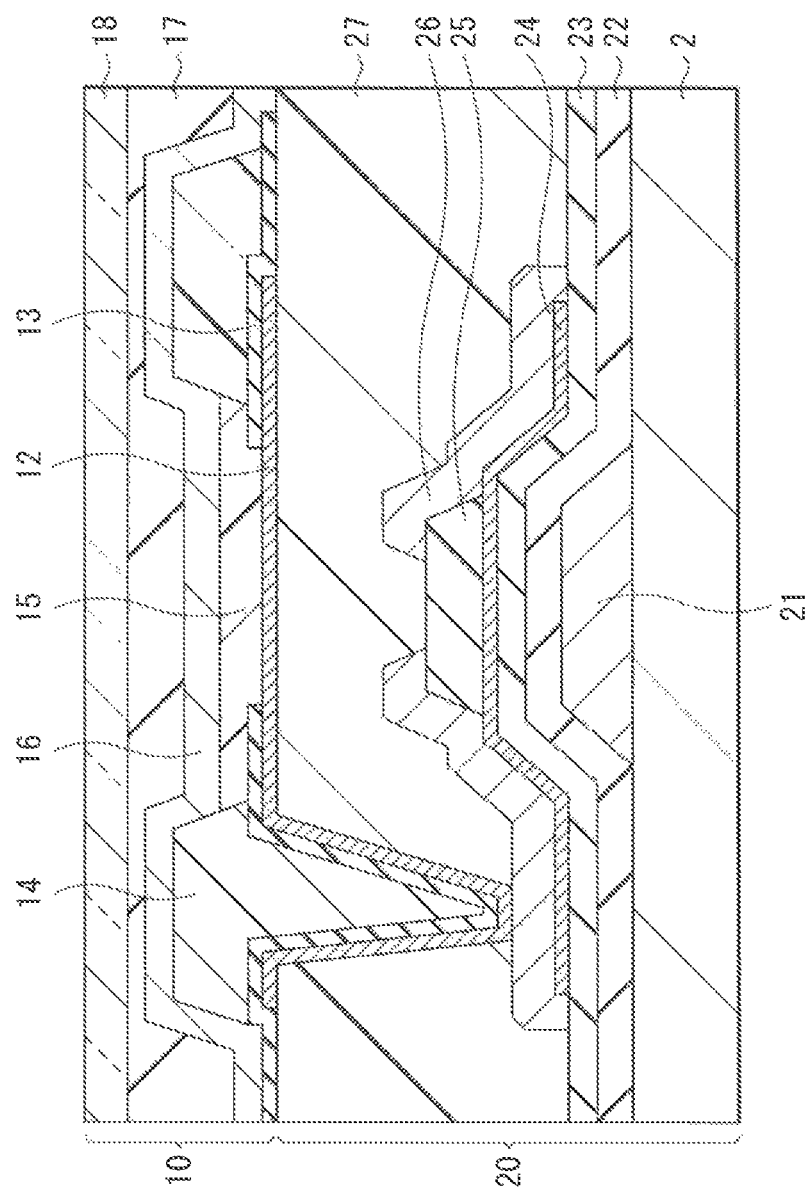

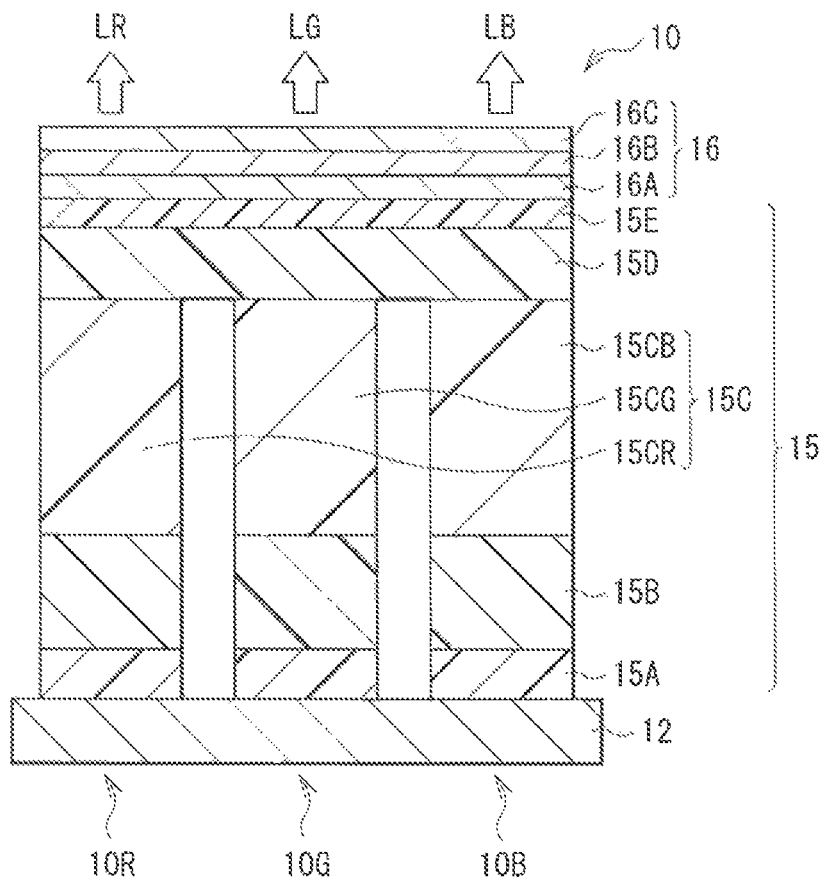
[FIG. 3]

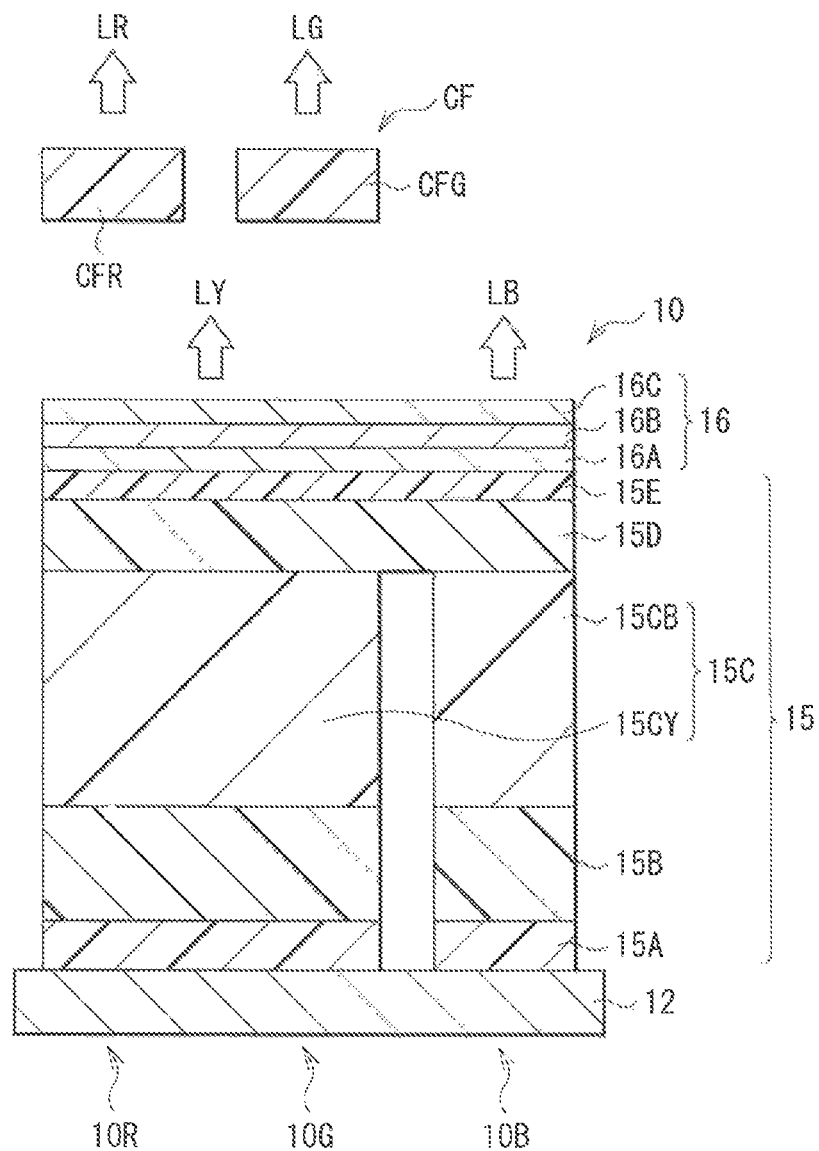
[ FIG. 4 ]

[FIG. 5]
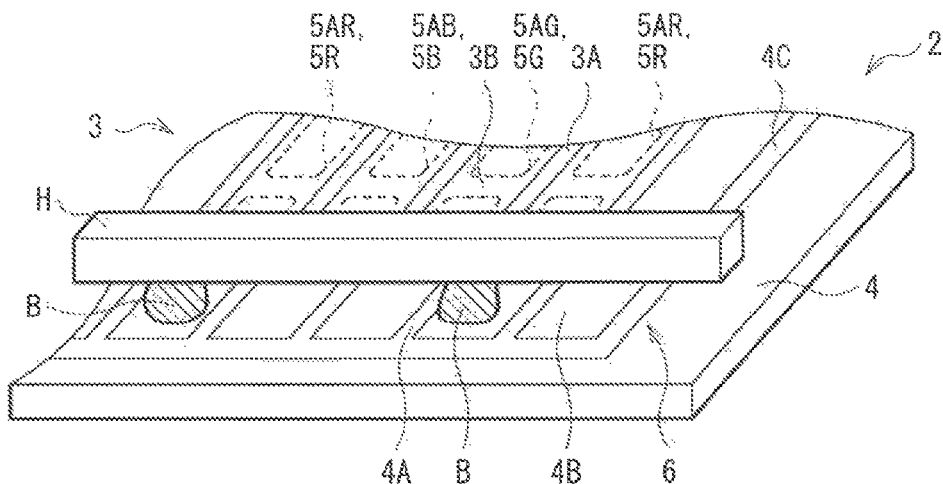
[FIG. 6]
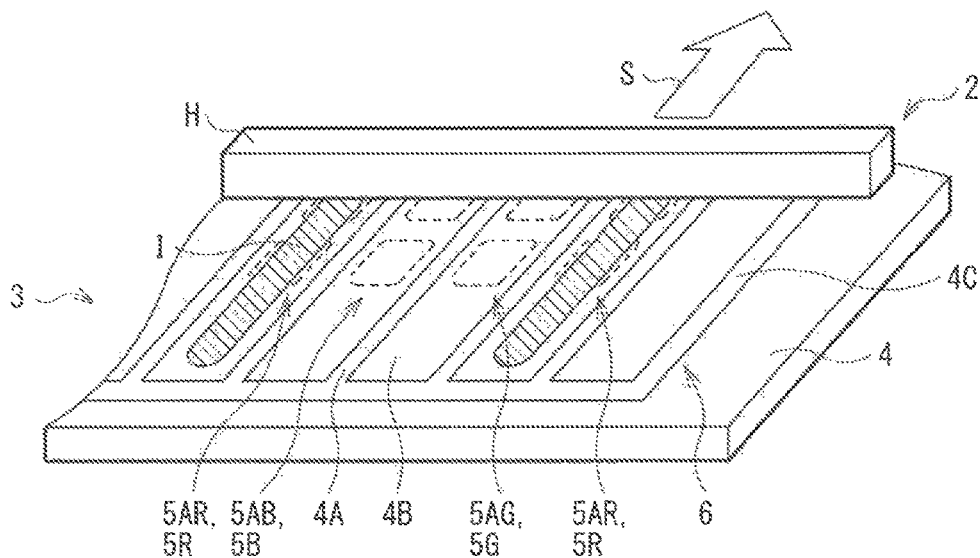

[ FIG. 7 ]
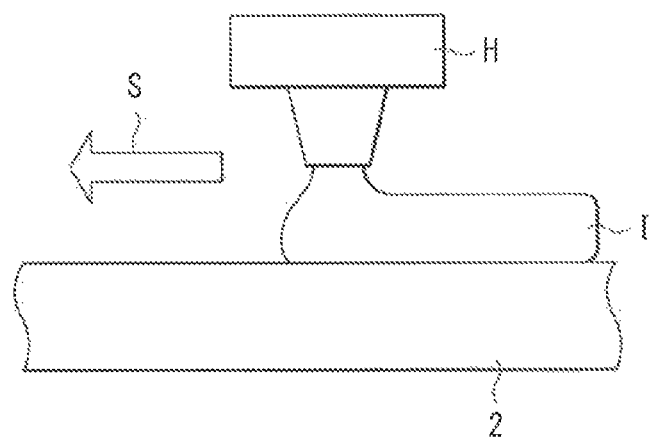

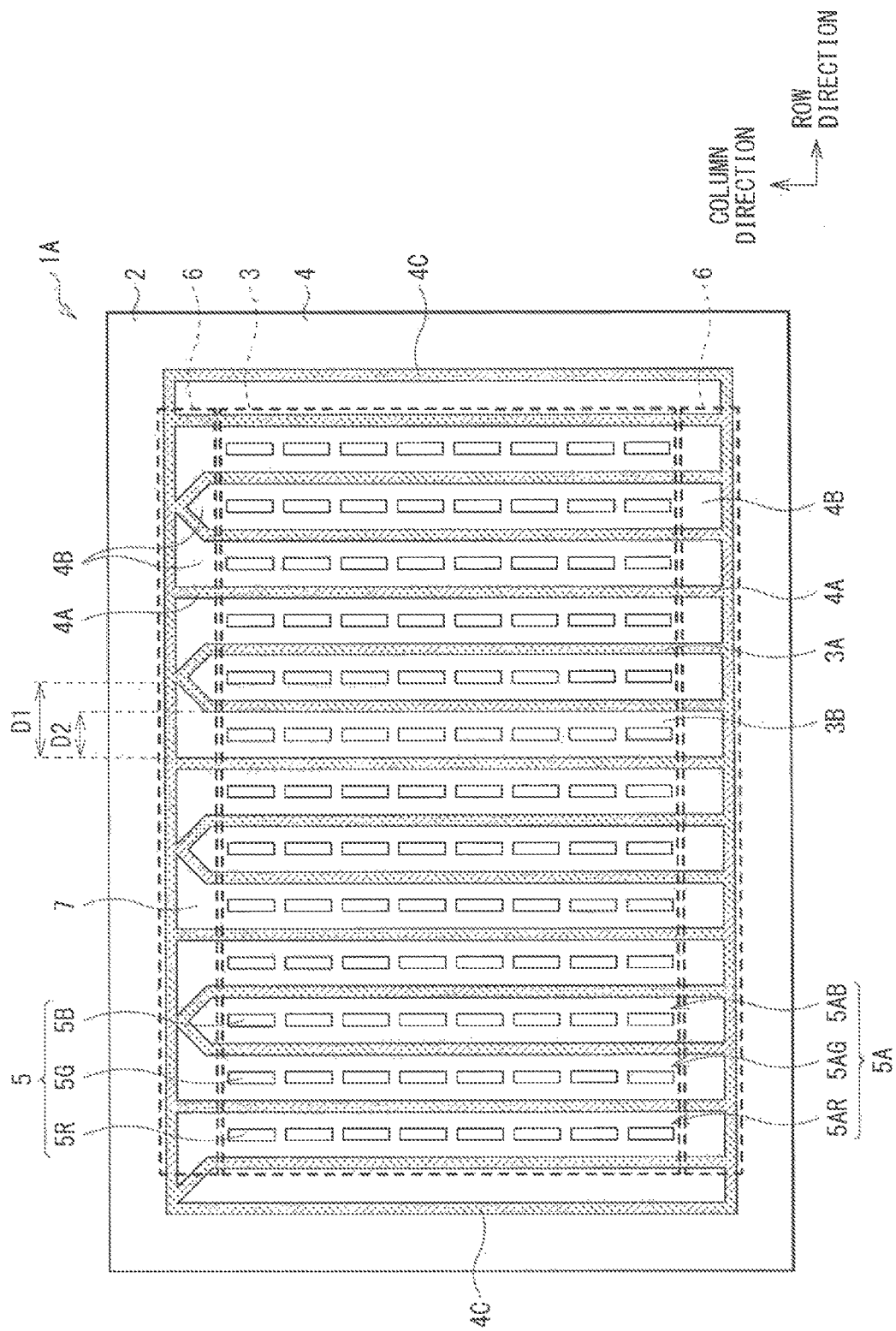
[FIG. 8]

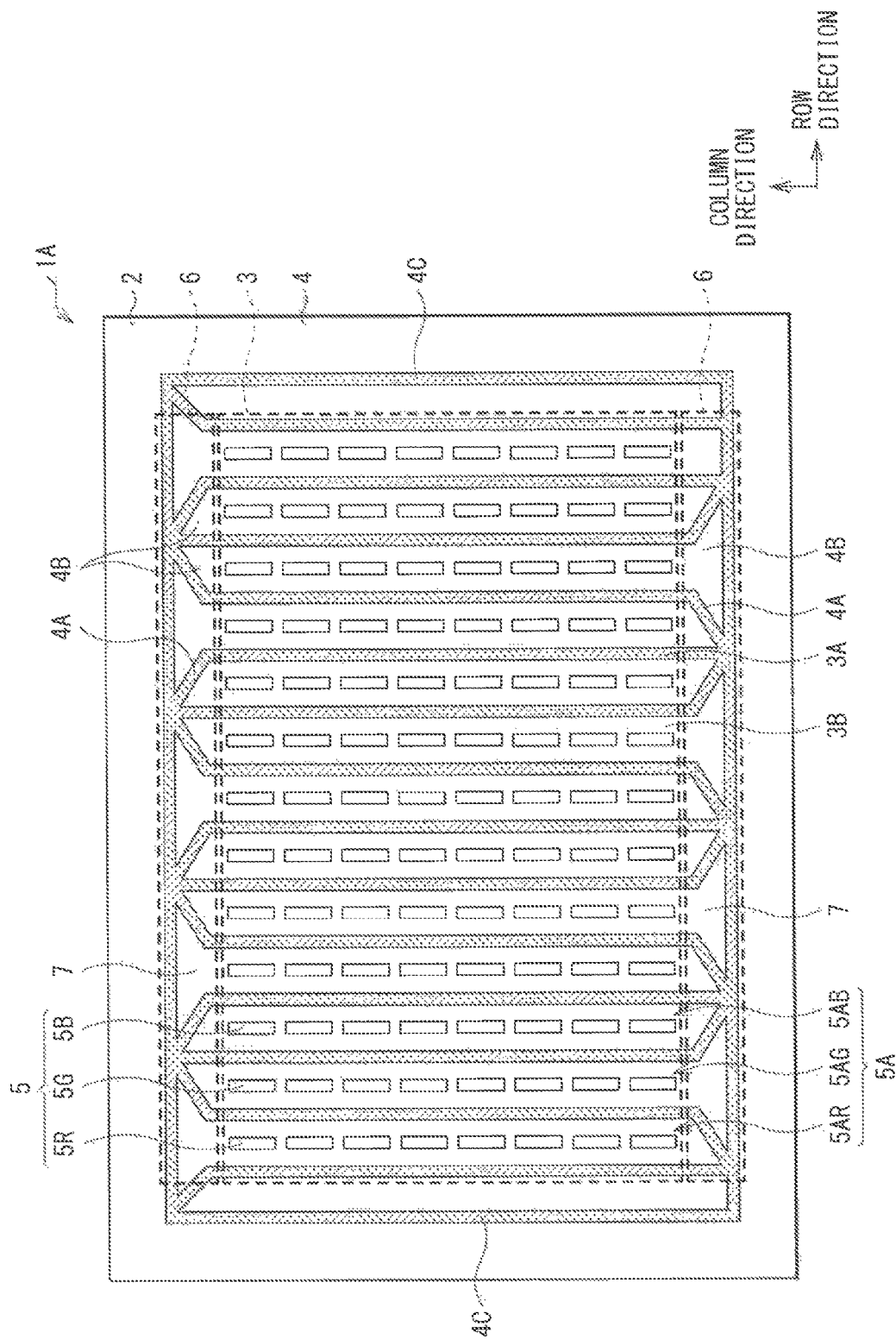
[FIG. 9]

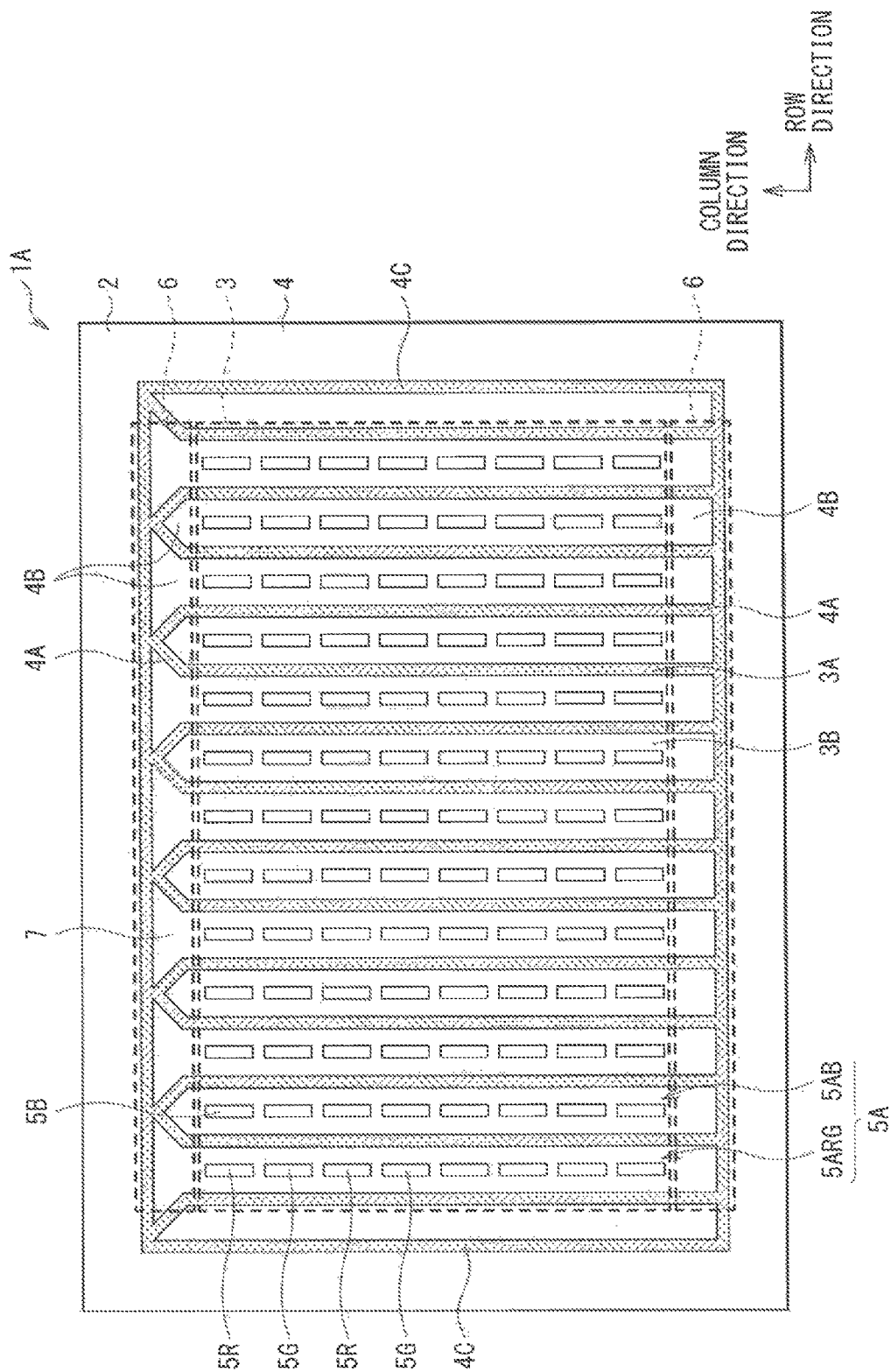
[FIG. 10]

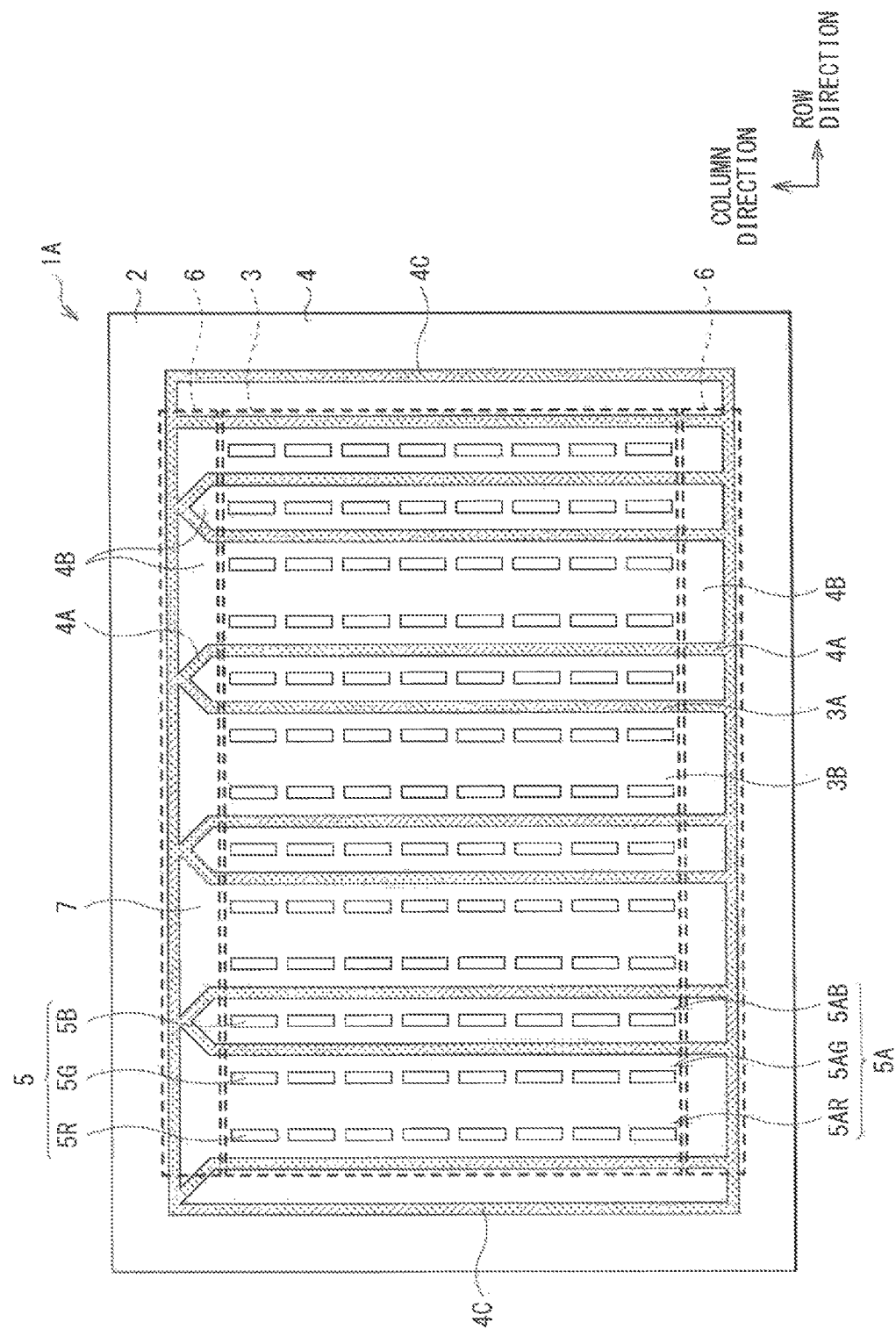
[FIG. 1L]

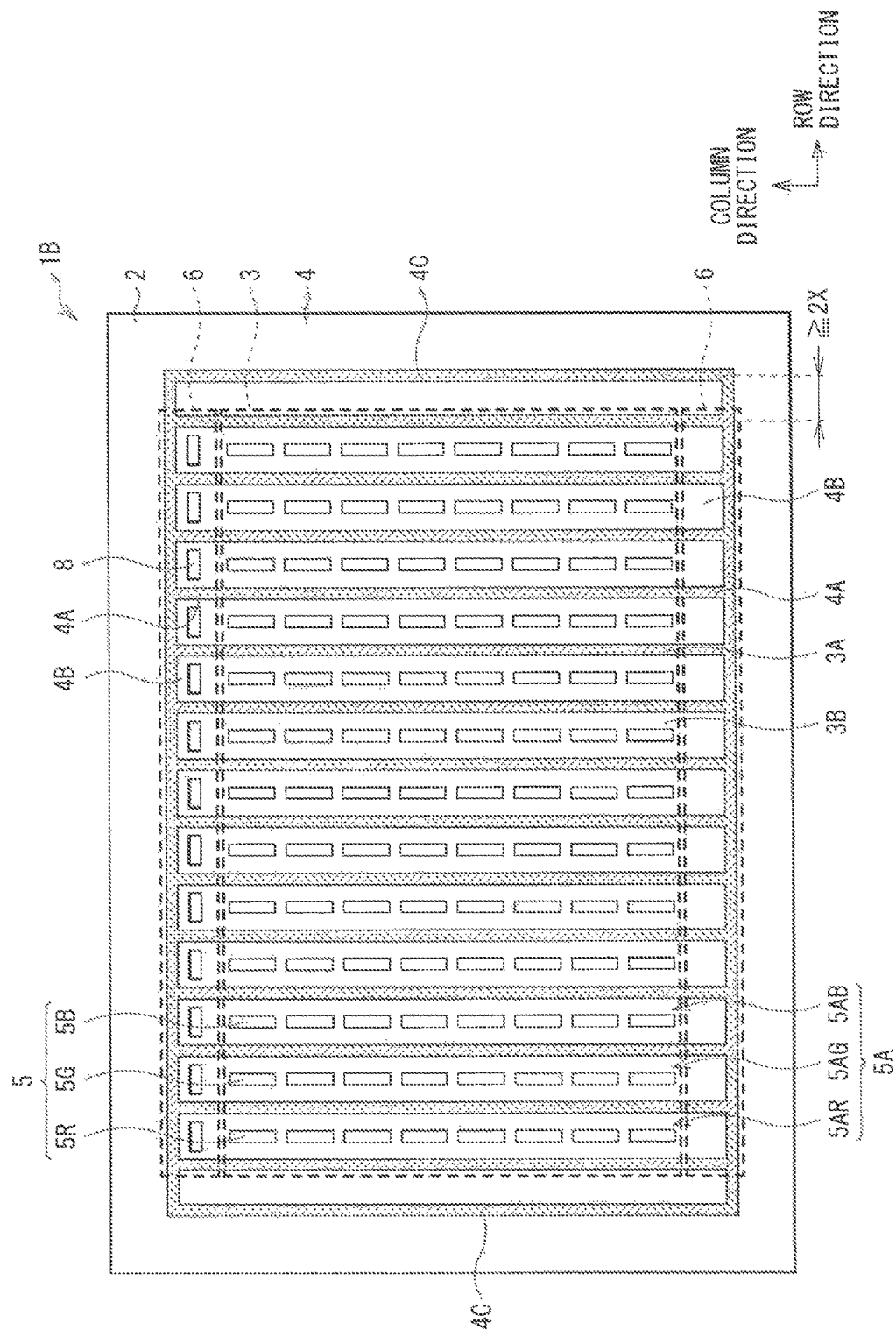
[FIG. 12]

[ FIG. 13 ]
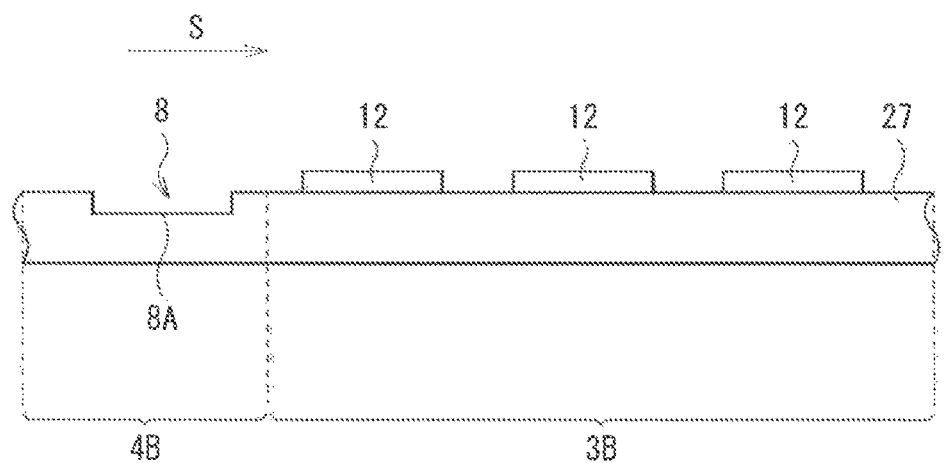
[ FIG. 14 ]
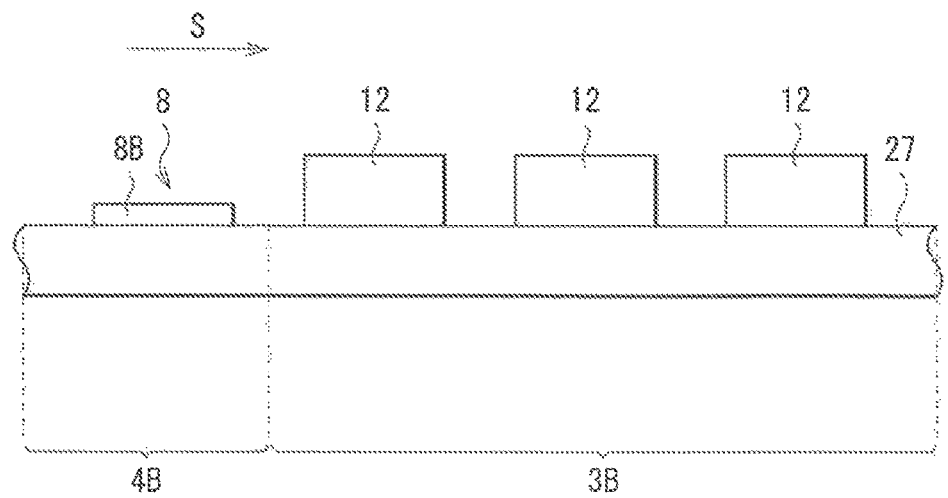

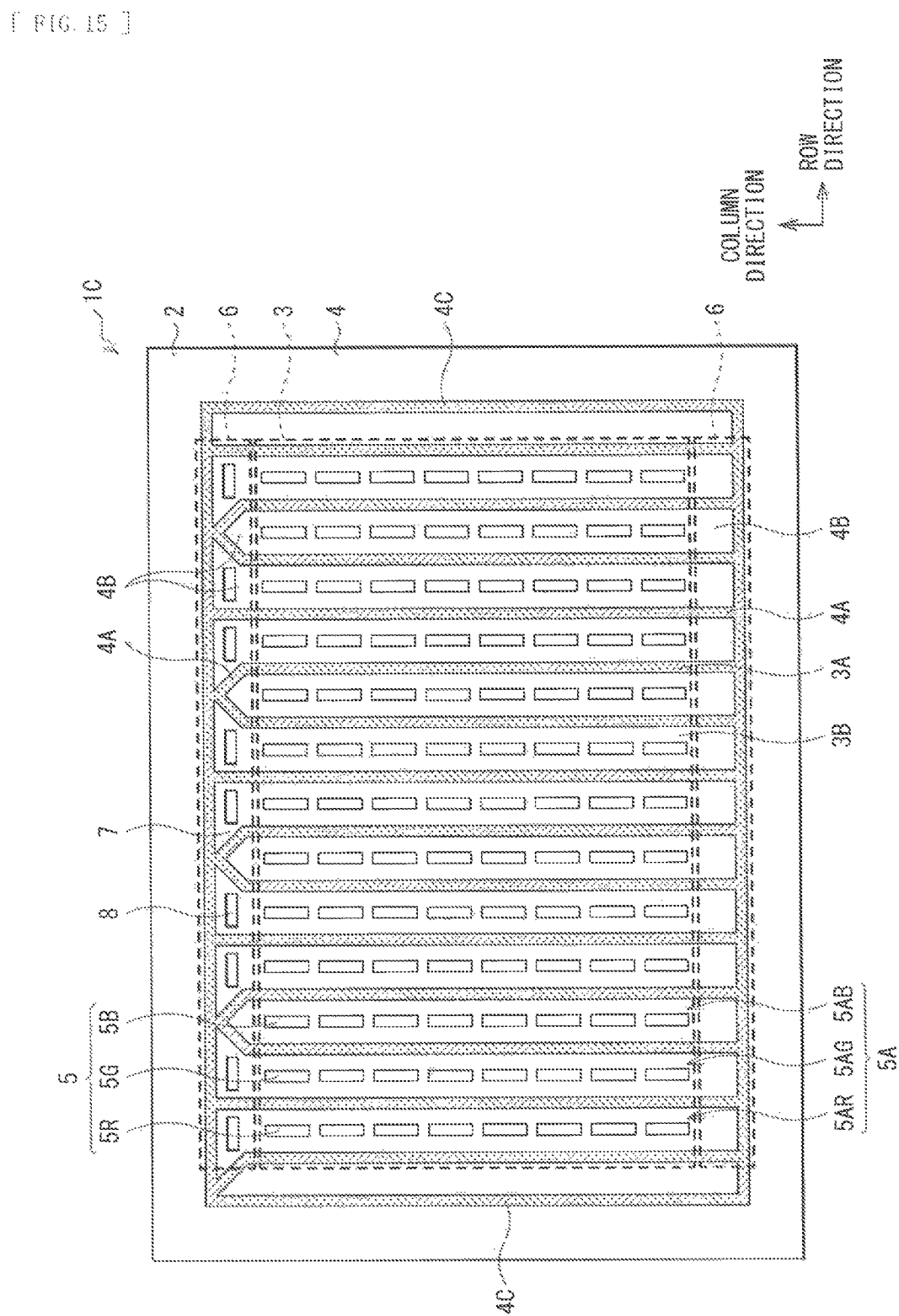

[ FIG. 16 ]
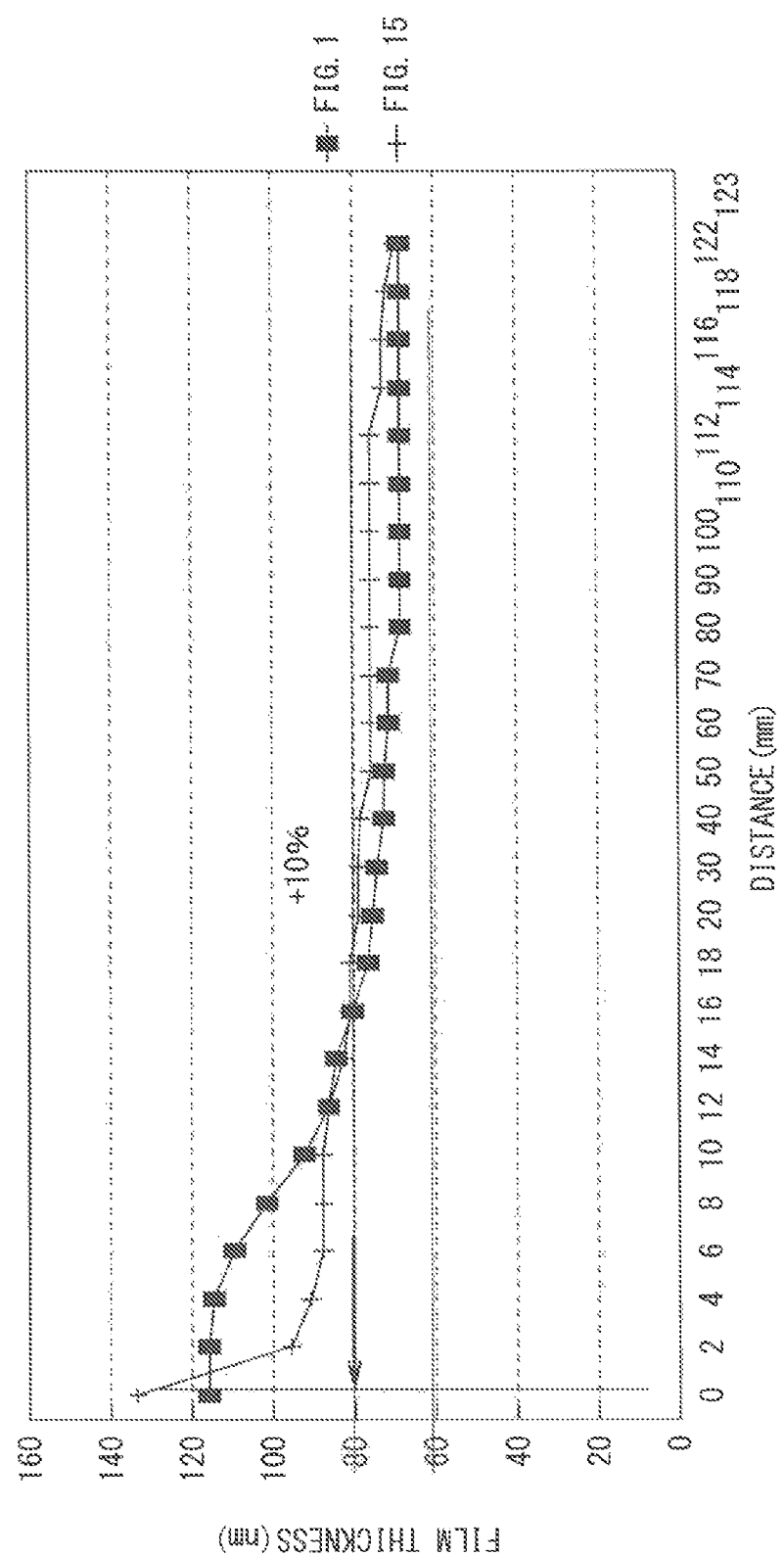

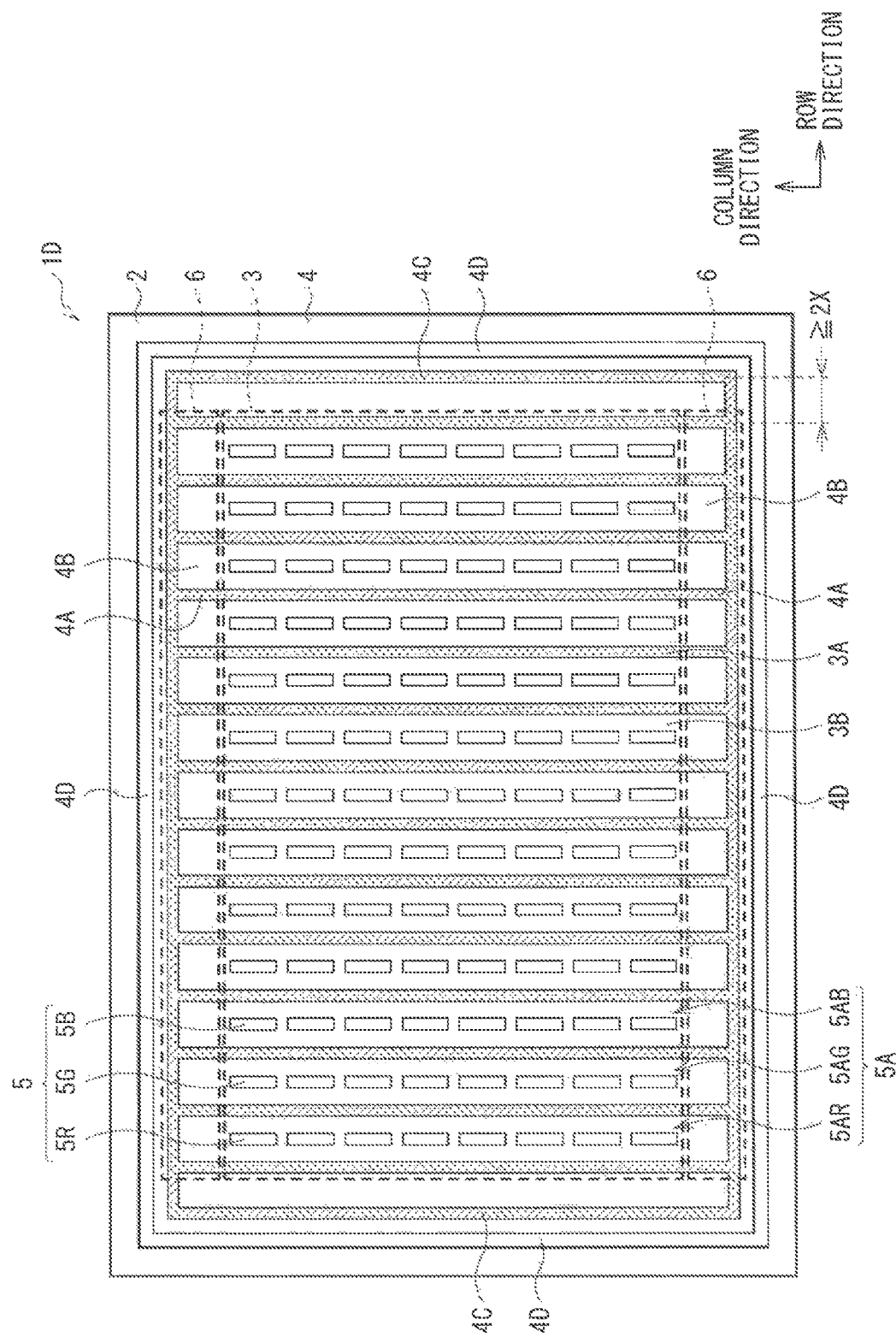
[FIG. 17]

[ FIG. 18 ]
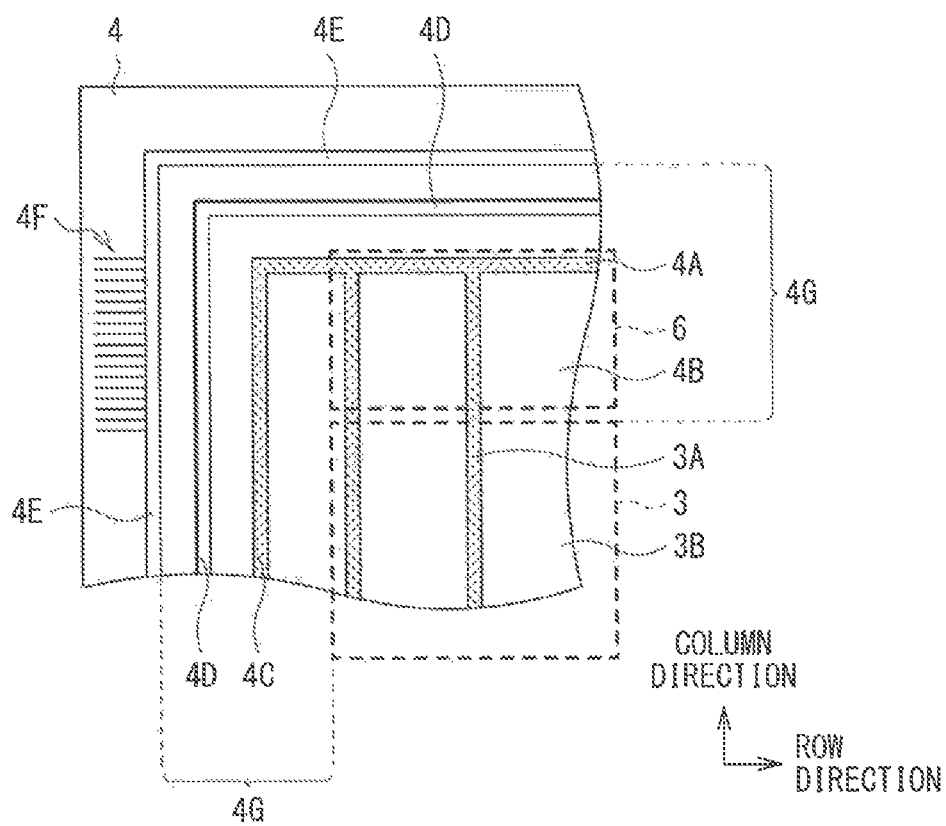

[ FIG. 19 ]
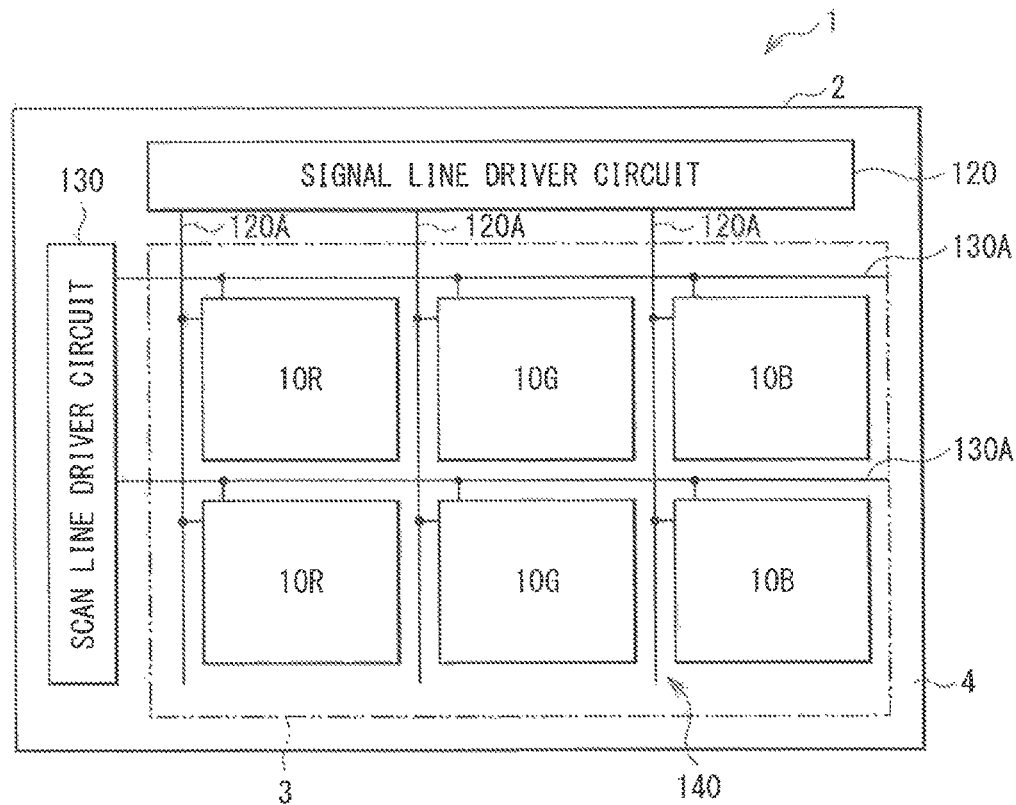
[ FIG. 20 ]
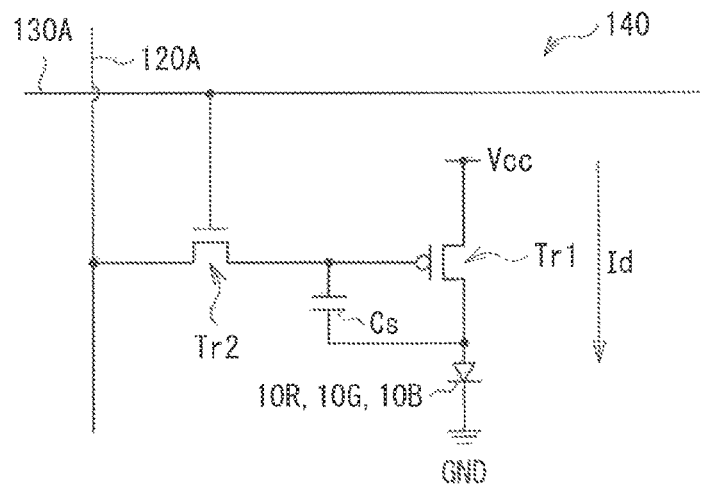

[FIG. 21]
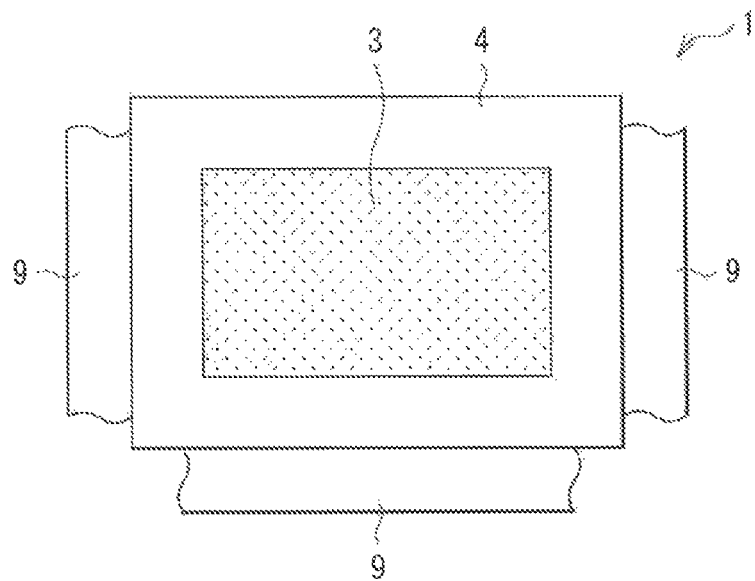
[FIG. 22]
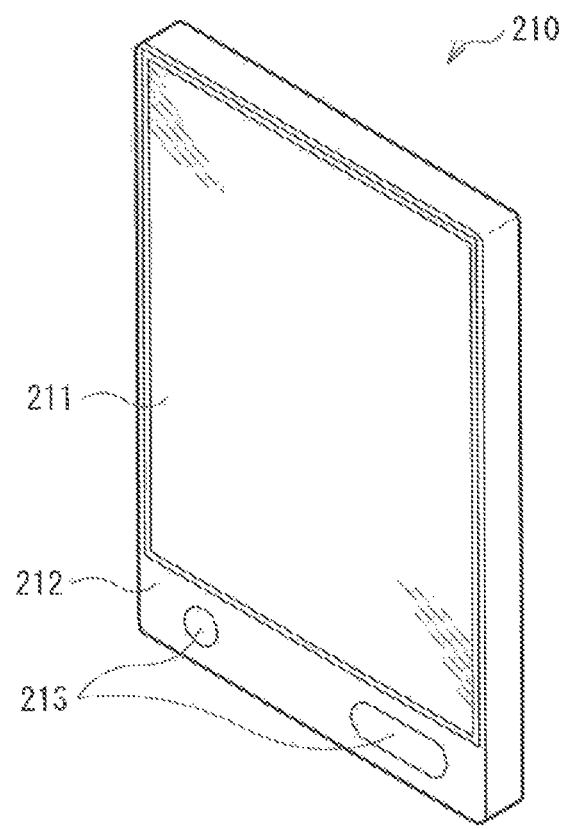

[ FIG. 23 ]
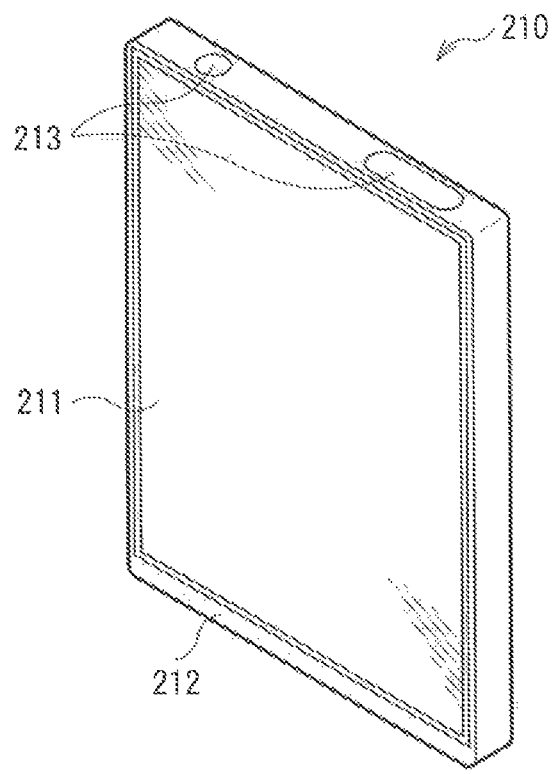
[ FIG. 24 ]
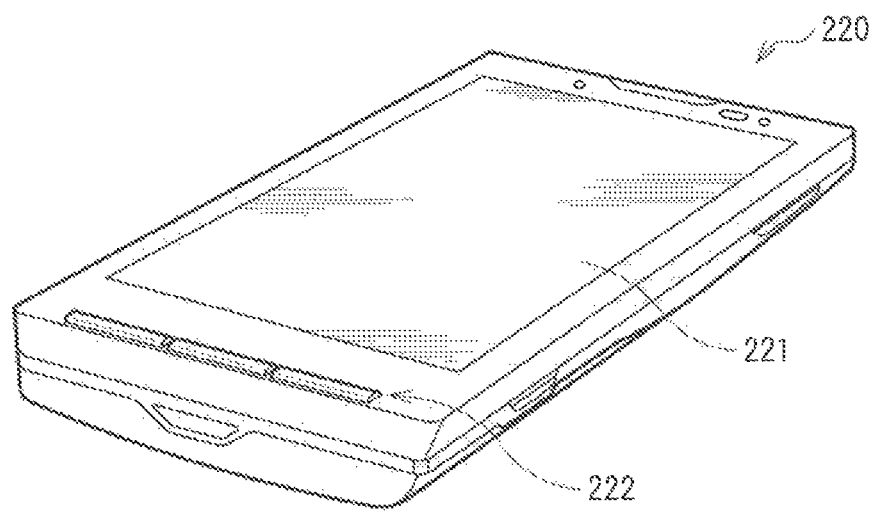

[FIG. 25]
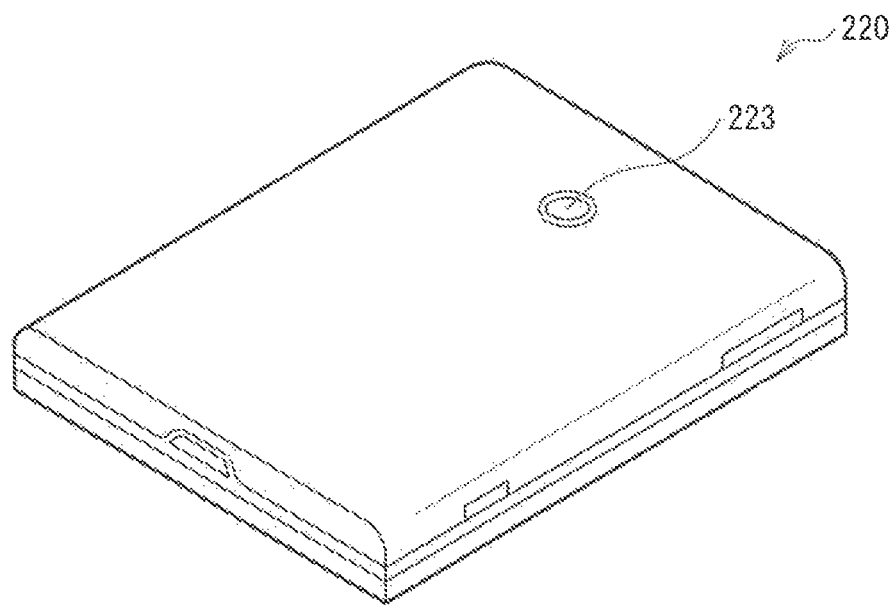
[FIG. 26]
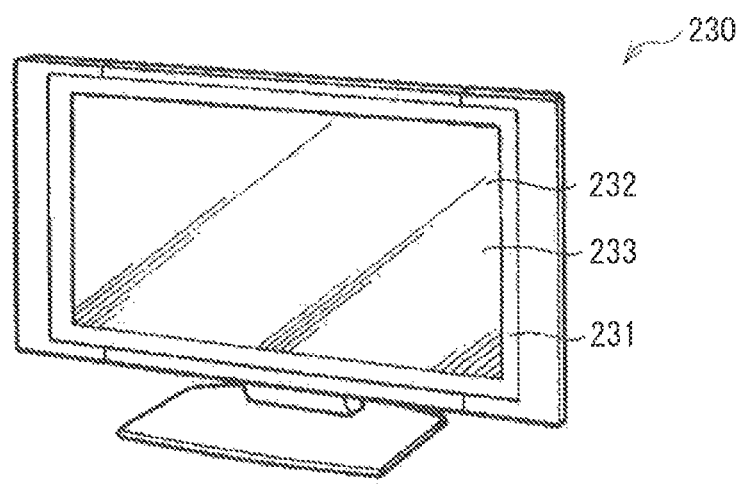

[ FIG. 27 ]
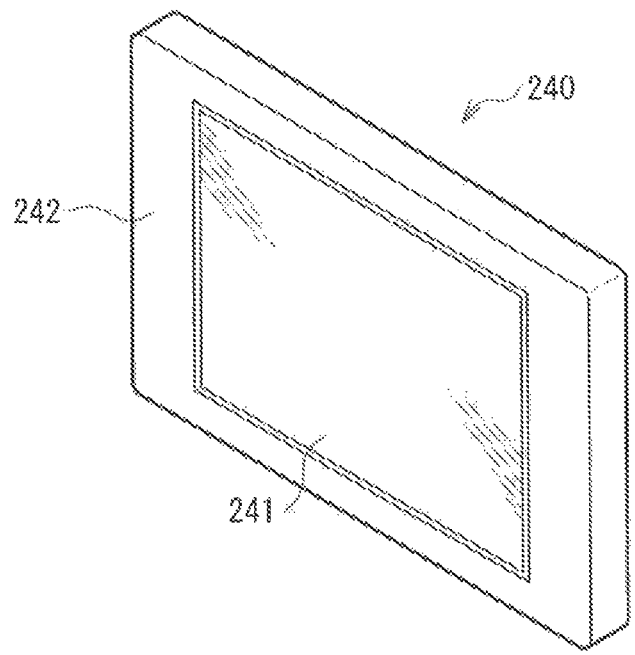
[ FIG. 28 ]
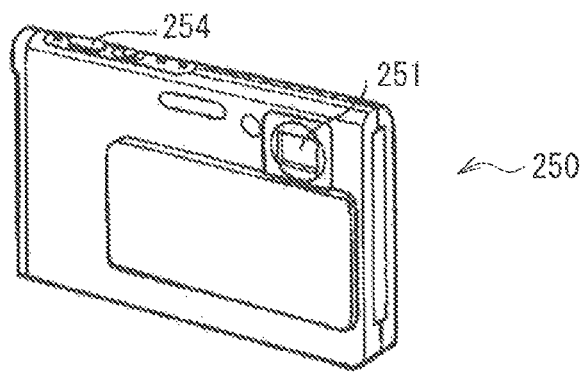
[ FIG. 29 ]
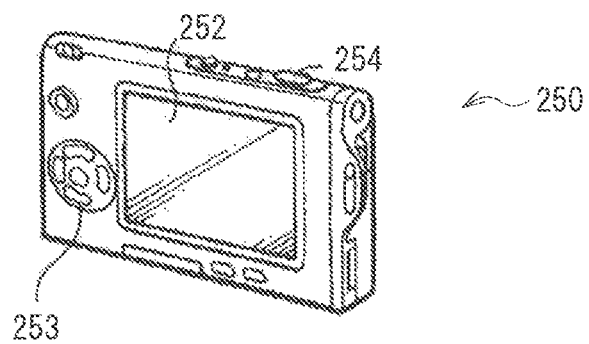

[ FIG. 30 ]
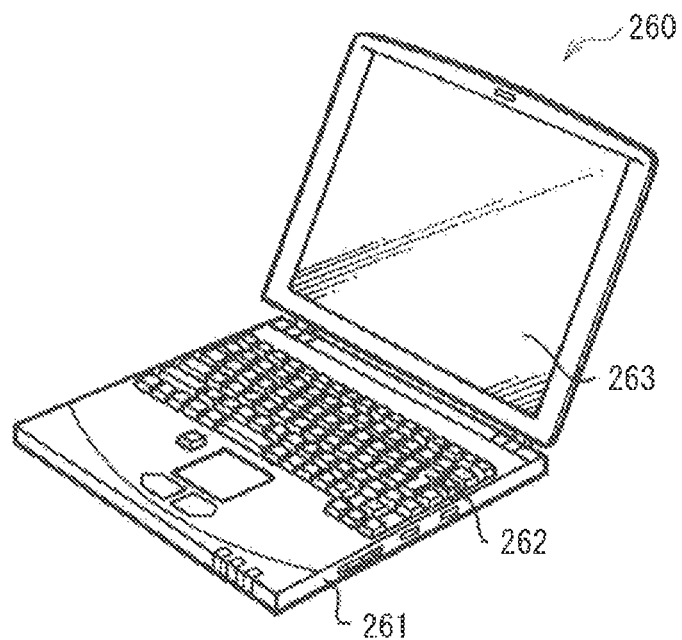
[ FIG. 31 ]
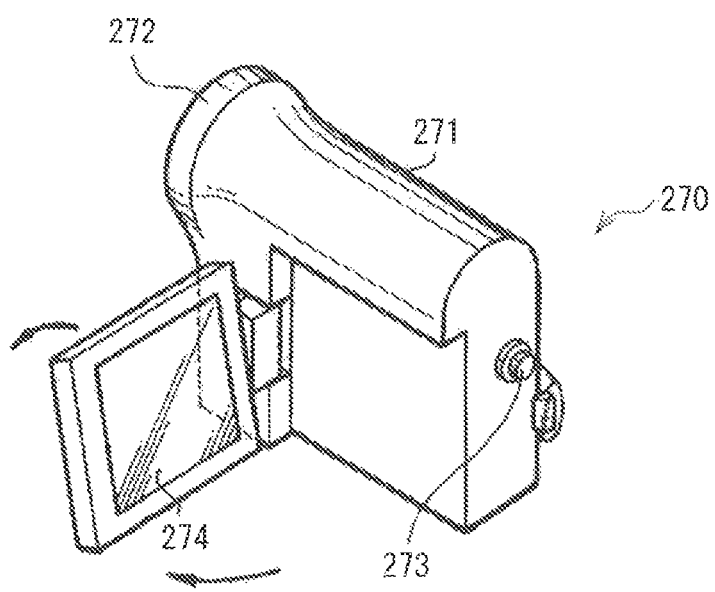

[ FIG. 32 ]
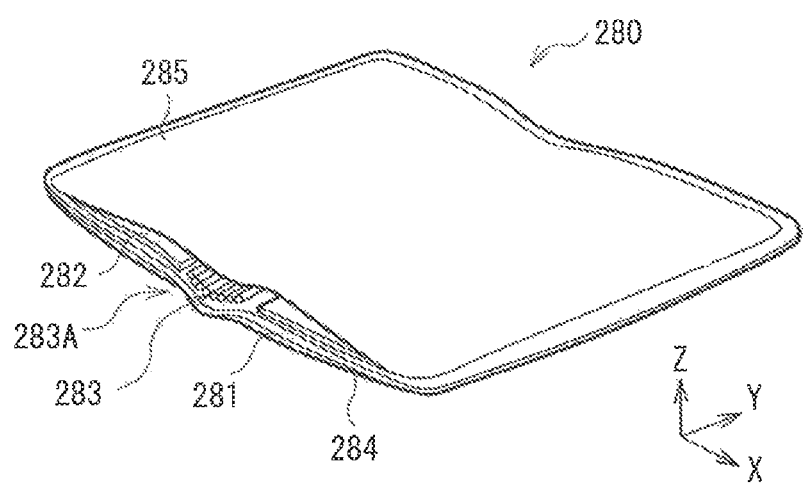
[ FIG. 33 ]
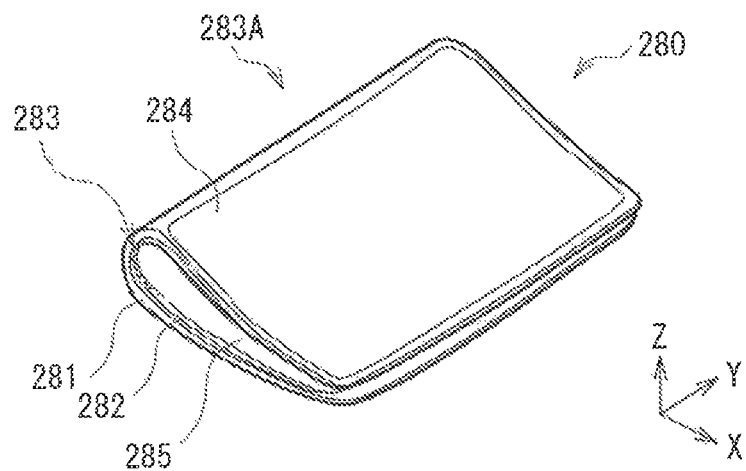

[FIG. 34]
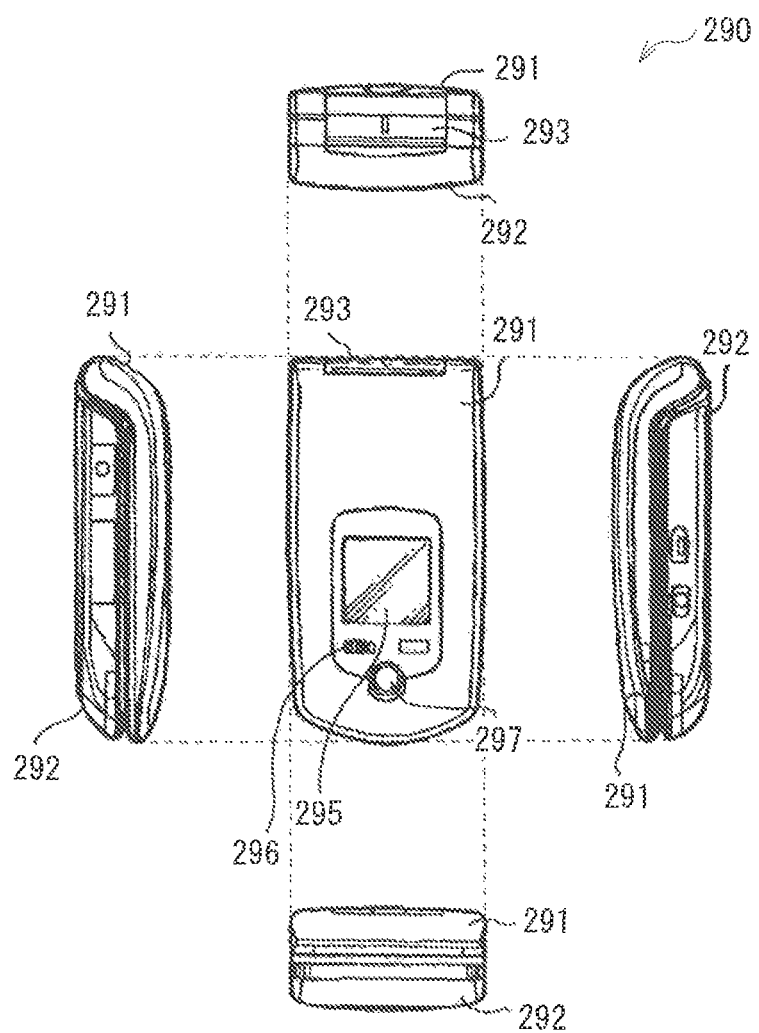

[ FIG. 35 ]
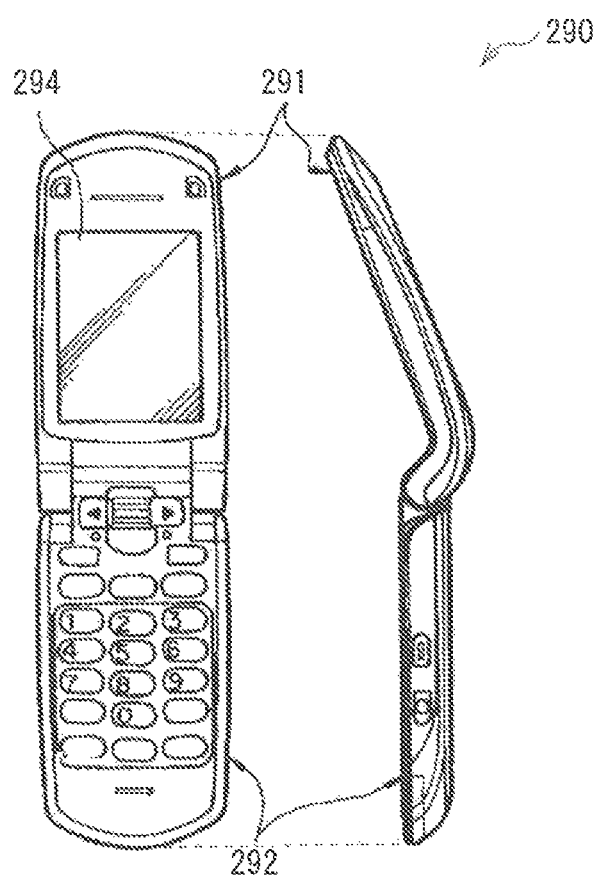

DISPLAY DEVICE AND ELECTRONIC APPARATUS

CROSS REFERENCES TO RELATED APPLICATIONS

The present application is a national stage of International Application No. PCT/JP2014/073014 filed on Sep. 2, 2014 and claims priority to Japanese Patent Application No. 2013-195769 filed on Sep. 20, 2013, the disclosure of which is incorporated herein by reference.

BACKGROUND

The disclosure relates to a display device suitable for an organic electroluminescence (EL) display device or other display devices, and an electronic apparatus provided with the display device.

A display device is configured of a stack of many layers such as wirings, electrodes, light-emission layers, and inter-layer insulating films. Materials of these layers range from inorganic films to organic films. Moreover, some layers may be formed over an almost entire surface of a substrate, while other layers may be formed in desired patterns on the substrate.

One of methods of forming a layer on an almost entire surface of a substrate is vacuum vapor deposition. Vacuum vapor deposition is used in deposition of organic materials, typically for light-emission layers or other layers of organic EL elements. Specifically, a mask having an aperture is interposed between a vapor deposition source and a substrate to allow for formation of a layer inside the aperture; the aperture is configured to face an almost entirety of the substrate.

Meanwhile, patterned deposition of organic materials by vacuum vapor deposition involves using a mask that has an aperture shaped according to the pattern. This may however cause disadvantages such as difficulties in alignment and low efficiency in utilization of materials. Accordingly, there has been explored other deposition methods including transfer methods and coating methods.

For example, in a case of formation of a stripe pattern by a coating method, one head is provided with a plurality of slots spaced according to a pitch of the striped pattern, and the head is moved. Thus, a single scan allows for formation of a stripe layer shaped of a plurality of lines. Such a stripe coating method may be applied to, for example, deposition of color-separated light-emission layers of organic EL elements (for example, refer to Patent Literature 1).

CITATION LIST

Patent Literature

Patent Literature 1: JP 2012-256587A

SUMMARY

However, in existing deposition methods such as vacuum vapor deposition and coating methods, wetting and spreading of deposited materials may cause possibility of formation of a layer over a wider region than desired, and there is room for improvement in terms of higher pattern precision.

It is therefore desirable to provide a display device that allows for highly precise patterning, and an electronic apparatus provided with the display device.

A first display device according to an embodiment of the disclosure includes: a pixel region that includes a plurality of pixels arranged in a matrix; and a peripheral region outside of the pixel region. The pixel region includes first liquid-repellent parts in inter-column regions between the plurality of pixels. The peripheral region includes second liquid-repellent parts that are continuous with the first liquid-repellent parts.

In the first display device according to the embodiment of the disclosure, the pixel region includes the first liquid-repellent parts in the inter-column regions between the plurality of pixels. The peripheral region includes the second liquid-repellent parts that are continuous with the first liquid-repellent parts. Therefore, a deposited material is prevented, by the first liquid-repellent parts in the pixel region, and by the second liquid-repellent parts in the peripheral region, from wetting and spreading, or causing any other inconvenience. This allows a pattern to be precisely defined.

A second display device according to an embodiment of the disclosure includes: a pixel region that includes a plurality of pixels arranged in a matrix; and a peripheral region outside of the pixel region. The peripheral region includes third liquid-repellent parts outside of pixel columns located at both ends in a row direction of the plurality of pixels.

In the second display device according to the embodiment of the disclosure, the peripheral region includes the third liquid-repellent parts outside of the pixel columns located at both ends in the row direction of the plurality of pixels. Therefore, a deposited material is prevented, by the third liquid-repellent parts, from wetting and spreading, or causing any other inconvenience. This allows a pattern to be precisely defined.

A third display device according to an embodiment of the disclosure includes: a pixel region that includes a plurality of pixels arranged in a matrix; and a peripheral region outside of the pixel region. The pixel region includes first liquid-repellent parts in inter-column regions between the plurality of pixels. The peripheral region includes second liquid-repellent parts, third liquid-repellent parts, and a trench. The second liquid-repellent parts are continuous with the first liquid-repellent parts. The third liquid-repellent parts are provided outside of pixel columns located at both ends in a row direction of the plurality of pixels. The trench surrounds the second liquid-repellent parts and the third liquid-repellent parts.

In the third display device according to the embodiment of the disclosure, the peripheral region includes provided with the trench that surrounds the second liquid-repellent parts and the third liquid-repellent parts. Therefore, a deposited material is prevented, by the trench, from wetting and spreading, or causing any other inconvenience. This allows a pattern to be precisely defined.

A first electronic apparatus according to an embodiment of the disclosure is provided with a display device. The display device includes: a pixel region that includes a plurality of pixels arranged in a matrix; and a peripheral region outside of the pixel region. The pixel region includes first liquid-repellent parts in inter-column regions between the plurality of pixels. The peripheral region includes second liquid-repellent parts that are continuous with the first liquid-repellent parts.

A second electronic apparatus according to an embodiment of the disclosure is provided with a display device. The display device includes: a pixel region that includes a plurality of pixels arranged in a matrix; and a peripheral region outside of the pixel region. The peripheral region includes third liquid-repellent parts outside of pixel columns located at both ends in a row direction of the plurality of pixels.

A third electronic apparatus according to an embodiment of the disclosure is provided with a display device. The display device includes: a pixel region that includes a plurality of pixels arranged in a matrix; and a peripheral region outside of the pixel region. The pixel region includes first liquid-repellent parts in inter-column regions between the plurality of pixels. The peripheral region includes second liquid-repellent parts, third liquid-repellent parts, and a trench. The second liquid-repellent parts are continuous with the first liquid-repellent parts. The third liquid-repellent parts are provided outside of pixel columns located at both ends in a row direction of the plurality of pixels. The trench surrounds the second liquid-repellent parts and the third liquid-repellent parts.

In the first to third electronic apparatuses according to the embodiments of the disclosure, image display is performed by the display devices.

According to the first display device according to the embodiment of the disclosure, or the first electronic apparatus according to the embodiment of the disclosure, the pixel region includes the first liquid-repellent parts in the inter-column regions between the plurality of pixels. The peripheral region includes the second liquid-repellent parts that are continuous with the first liquid-repellent parts. Hence, it is possible to allow the first liquid-repellent parts in the pixel region and the second liquid-repellent parts in the peripheral region to prevent a deposited material from wetting and spreading, or causing any other inconvenience. This allows for highly precise patterning.

According to the second display device of the embodiment of the disclosure, or the second electronic apparatus of the embodiment of the disclosure, the peripheral region includes the third liquid-repellent parts outside of the pixel columns located at both ends in the row direction of the plurality of pixels. Hence, it is possible to allow the third liquid-repellent parts to prevent a deposited material from wetting and spreading, or causing any other inconvenience. This allows for highly precise patterning.

According to the third display device of the embodiment of the disclosure, or the third electronic apparatus of the embodiment of the disclosure, the peripheral region includes the trench that surrounds the second liquid-repellent parts and the third liquid-repellent parts. Hence, it is possible to allow the trench to prevent a deposited material from wetting and spreading, or causing any other inconvenience. This allows for highly precise patterning.

Additional features and advantages are described herein, and will be apparent from the following Detailed Description and the figures.

BRIEF DESCRIPTION OF THE FIGURES

FIG. 1 is a plan view of a configuration of a display device according to a first embodiment of the disclosure.

FIG. 2 is a cross-sectional view of one example of one pixel illustrated in FIG. 1.

FIG. 3 is a cross-sectional view of one example of an organic layer illustrated in FIG. 2.

FIG. 4 is a cross-sectional view of another example of the organic layer illustrated in FIG. 2.

FIG. 5 is a schematic diagram provided for description of a formation method of a light-emission layer illustrated in FIG. 3.

FIG. 6 is a schematic diagram of a process following FIG. 5.

FIG. 7 is a schematic diagram of a state in FIG. 6, viewed from another direction.

FIG. 8 is a plan view of a configuration of a display device according to a second embodiment of the disclosure.

FIG. 9 is a plan view of a modification example of the display device illustrated in FIG. 8.

FIG. 10 is a plan view of another modification example of the display device illustrated in FIG. 8.

FIG. 11 is a plan view of still another modification example of the display device illustrated in FIG. 8.

FIG. 12 is a plan view of a configuration of a display device according to a third embodiment of the disclosure.

FIG. 13 is a cross-sectional view of one example of a recess illustrated in FIG. 12.

FIG. 14 is a cross-sectional view of another example of the recess illustrated in FIG. 12.

FIG. 15 is a plan view of a configuration of a display device according to a fourth embodiment of the disclosure.

FIG. 16 is a diagram of a result of examination of relation between a distance in a pixel region and a film thickness, in the display device illustrated in FIG. 15.

FIG. 17 is a plan view of a configuration of a display device according to a fifth embodiment of the disclosure.

FIG. 18 is a plan view, in an enlarged manner, of a peripheral region illustrated in FIG. 17.

FIG. 19 is a schematic diagram of an overall configuration of the display device illustrated in FIG. 1.

FIG. 20 is a diagram of one example of a pixel drive circuit of the display device illustrated in FIG. 19.

FIG. 21 is a plan view of a schematic configuration of a module that includes the display device according to the example embodiments.

FIG. 22 is a perspective view of an appearance of an application example 1.

FIG. 23 is another perspective view of the appearance of the application example 1.

FIG. 24 is a perspective view of an appearance of an application example 2, viewed from front side.

FIG. 25 is a perspective view of the appearance of the application example 2, viewed from back side.

FIG. 26 is a perspective view of an appearance of an application example 3.

FIG. 27 is a perspective view of the appearance of application example 4.

FIG. 28 is a perspective view of an appearance of an application example 5, viewed from front side.

FIG. 29 is a perspective view of the appearance of the application example 5, viewed from back side.

FIG. 30 is a perspective view of an appearance of an application example 6.

FIG. 31 is a perspective view of an appearance of an application example 7.

FIG. 32 is a perspective view of an opened state of an application example 8.

FIG. 33 is a perspective view of a closed state of the application example 8.

FIG. 34 is a view of a closed state of an application example 9.

FIG. 35 is a view of an opened state of the application example 9.

DETAILED DESCRIPTION

In the following, some embodiments of the disclosure are described in detail with reference to the drawings. Note that description is made in the following order.

1. First Embodiment (an example in which a pixel region includes first lyophilic parts and first liquid-repellent parts, and a peripheral region includes second lyophilic parts, second liquid-repellent parts, and third liquid-repellent parts)
2. Second Embodiment (an example with widened sections in the second lyophilic parts)
3. Third Embodiment (an example with recesses in the second lyophilic parts)
4. Fourth Embodiment (an example with both the widened sections and the recesses in the second lyophilic parts)
5. Fifth Embodiment (an example with a trench in the peripheral region)
6. Overall Configuration of Display Device
7. Application Examples (electronic apparatuses)

First Embodiment

FIG. 1 illustrates a plan configuration of a display device 1 according to a first embodiment of the disclosure. The display device 1 may be an organic EL display device used in, for example, a television set or a monitor device, and may include: a pixel region 3 in a center of a substrate 2; and a peripheral region 4 outside of the pixel region 3.

The pixel region 3 may be a rectangular-shaped region in which a plurality of pixels 5 are arranged in rows and columns (i.e., in a matrix). The plurality of pixels 5 may be configured of, for example, red pixels 5R, green pixels 5G, and blue pixels 5B. The pixels 5 (5R, 5G, and 5B) may be provided with organic EL elements 10 (10R, 10G, and 10B) in respectively corresponding colors, as described later. The arrangement of the red pixels 5R, the green pixels 5G, and the blue pixels 5B is not limited in particular; for example, in a television use, the pixels 5 (5R, 5G, and 5B) in same colors may be arranged in a column direction to form pixel columns 5A (5AR, 5AG, and 5AB) that are arranged in a row direction. The pixel columns 5A (5AR, 5AG, and 5AB) may constitute the pixel region 3 of a laterally-long rectangular shape as a whole. Each of the red pixels 5R, the green pixels 5G, and the blue pixels 5B may constitute a sub-pixel. A combination of the red pixel 5R, the green pixel 5G, and the blue pixel 5B adjacent to one another may constitute one display pixel (one pixel). Note that the pixel region 3 as used herein may include a so-called effective area that actually provides image display, and dummy pixels outside.

The peripheral region 4 may be a region shaped of a rectangular frame that surrounds the pixel region 3, and may be provided with external connection terminals, a sealing section, and other components (as described later). Moreover, the peripheral region 4 may include bead formation regions 6 along two opposite sides, i.e., an upper side and a lower side, of the pixel region 3. The bead formation regions 6 are regions in which an ink is discharged at positions of start of coating in the peripheral region 4 to form a liquid column (a bead) in formation of a light-emission layer 15C (as described later) of the organic EL elements 10 by a coating method.

The pixel region 3 includes first liquid-repellent parts 3A in inter-column regions between the plurality of pixels 5. The peripheral region 4 includes second liquid-repellent parts 4A that are continuous with the first liquid-repellent parts 3A. Hence, in the display device 1, it is possible to perform highly precise patterning.

The first liquid-repellent parts 3A may serve as a bank (an embankment) for the ink in color-separated formation of the light-emission layer 15C (as described later) of the organic EL elements 10 by a coating method. The first liquid-repellent parts 3A are adapted to restrain excessive wetting and spreading of the ink discharged on the pixel columns 5A, specifically, intrusion into the adjacent pixel columns 5A, and may be provided in shapes of lines that define or separate the pixel columns 5A.

Examples of materials of the first liquid-repellent parts 3A may include organic materials such as polyimide and novolac; liquid-repellency may be imparted to these materials by plasma treatment.

The second liquid-repellent parts 4A are adapted to restrain wetting and spreading of the ink discharged on the peripheral region 4 at the start of coating, and may be provided in shapes of lines that are continuous with the first liquid-repellent parts 3A. Materials of the second liquid-repellent parts 4A may be same as those of the first liquid-repellent parts 3A; liquid-repellency may be imparted to these materials by plasma treatment.

The first liquid-repellent parts 3A and the second liquid-repellent parts 4A may preferably form a closed frame shape that surrounds one or more columns of the plurality of pixels 5. The ink in which an organic material to form the light-emission layer 15C is dissolved has low viscosity, a small contact angle, and high wettability. The first liquid-repellent parts 3A and the second liquid-repellent parts 4A may surround the pixel column 5A in the closed frame shape, allowing for suppression of wetting and spreading of the ink. This makes it possible to precisely form the light-emission layer 15C.

The pixel region 3 may preferably include first lyophilic parts 3B in inter-row regions and the inter-column regions between the plurality of pixels 5. The first lyophilic parts 3B may be surrounded by the first liquid-repellent parts 3A. The peripheral region 4 may preferably include second lyophilic parts 4B that are surrounded by the second liquid-repellent parts 4A and are continuous with the first lyophilic parts 3B.

The first lyophilic parts 3B are adapted to enhance wettability of the ink, and may cover an entirety of the pixel region 3 while including apertures that face the respective pixels 5 (5R, 5G, and 5B). Moreover, the first lyophilic parts 3B may be divided or separated, for each column, by the first liquid-repellent parts 3A. This makes it possible to precisely form the color-separated light-emission layer 15C, allowing for even more highly precise patterning.

The first lyophilic parts 3B may be formed, with use of materials such as inorganic materials, for example, silicon dioxide ($SiO_2$), silicon carbide (SiC), silicon nitride ($Si_3N_4$), indium tin oxide (ITO), indium zinc oxide (IZO), aluminum (Al), titanium (Ti), and molybdenum (Mo), by methods such as vacuum vapor deposition, CVD (Chemical Vapor Deposition), and PVD (Physical Vapor Deposition).

The second lyophilic parts 4B are adapted to enhance wettability of the bead formation regions 6 to facilitate formation of the bead. Specifically, in the formation of the bead as a preparatory stage of the formation of the light-emission layer 15C by coating the first lyophilic parts 3B with the ink, it is possible to form a sufficient liquid pool (the bead) in the second lyophilic parts 4B. This allows for stable application of the ink to the first lyophilic parts 3B, making it possible to precisely form the light-emission layer 15C. In other words, regardless of a concentration (viscosity) of the ink, it is possible to perform accurate patterning of the light-emission layer 15C by an easy method, leading to enhancement in characteristics of the elements. Thus, it is possible to provide a full-color display device 1 with stable characteristics by an easy method.

The second lyophilic parts 4B and the bead formation regions 6 may be preferably provided in a symmetrical pattern, as illustrated in FIG. 1, on the two opposite sides (the upper side and the lower side) of the pixel region 3, that is, at both ends in a lengthwise direction of the pixel columns 5A. Note that the second lyophilic parts 4B and the bead formation region 6 may be provided at one end in the lengthwise direction of the pixel columns 5A. The second lyophilic parts 4B may be formed with use of same materials by same methods as those of the first lyophilic parts 3B.

The first lyophilic parts 3B and the second lyophilic parts 4B may be preferably continuous with one another, with no liquid-repellent parts formed therebetween. If liquid-repellent parts were provided between the first lyophilic parts 3B and the second lyophilic parts 4B, the ink would be disconnected there.

Furthermore, the peripheral region 4 may preferably include third liquid-repellent parts 4C outside of the pixel columns 5A at both ends in a row direction of the plurality of pixels 5. The third liquid-repellent parts 4C are adapted to restrain a liquid of an organic deposited material from flowing, in a direction perpendicular to a scanning direction, into wiring sections or other sections provided in the peripheral region 4, thereby allowing for highly precise patterning. The third liquid-repellent parts 4C may be made of the same materials as those of the first liquid-repellent parts 3A and the second liquid-repellent parts 4A. Moreover, the third liquid-repellent parts 4C may be provided in a singularity as illustrated in FIG. 1, or may be provided in a plurality.

A distance from the first liquid-repellent parts 3A to the third liquid-repellent parts 4C, or a distance from the second liquid-repellent parts 4A to the third liquid-repellent parts 4C may be preferably 2X μm or more, where alignment precision of an apparatus is X μm. Even in a case with use of an apparatus that does not include a highly precise alignment mechanism, the third liquid-repellent parts 4C may be arranged in dimensions in accordance with the apparatus, thereby allowing for highly precise patterning with a simple apparatus configuration. Hence, it is possible to form the display device 1 with stable characteristics.

FIG. 2 illustrates one example of a cross-sectional configuration of one pixel 5. Each pixel 5 may include, on the substrate 2, a TFT 20 and the organic EL element 10. The organic EL element 10 may be, for example, one of a red organic EL element 10R that produces red light, a green organic EL element 10G that produces green light, and a blue organic EL element 10B that produces blue light.

The TFT 20 may be a drive device that drives the organic EL element 10 by, for example, an active matrix method. Specifically, the TFT 20 may be a so-called bottom-gate TFT, and may use, for example, an oxide semiconductor as a channel (an active layer). In the TFT 20, on the substrate 2 made of glass or other materials, a gate electrode 21, a gate insulator film (a first gate insulator film 22 and a second gate insulator film 23), an oxide semiconductor layer 24, a channel protection film 25, and source/drain electrodes 26A and 26B may be formed in this order. Over the source/drain electrodes 26A and 26B, a planarization layer 27 may be formed over an entire surface of the substrate 2, to reduce level differences caused by the TFT 20.

The gate electrode 21 are adapted to control a carrier density (here, an electron density) in the oxide semiconductor layer 24 by a gate voltage applied to the TFT 20. The gate electrode 21 may be configured of, for example, a single-layer film made of one of Mo, Al, an aluminum alloy, and other materials, or a stacked film made of two or more of them. Note that examples of the aluminum alloy may include an aluminum-neodymium alloy.

The first gate insulator film 22 and the second gate insulator film 23 may be a single-layer film made of one of $SiO_2$, $Si_3N_4$, silicon nitride oxide (SiON), aluminum oxide ($Al_2O_3$), and other materials, or a stacked film made of two or more of them. Here, the first gate insulator film 22 and the second gate insulator film 23 may form a two-layer structure; the insulator film 22 may be, for example, a $SiO_2$ film, and the insulator film 23 may be, for example a $Si_3N_4$ film. A total film thickness of the gate insulator films 22 and 23 may be, for example, 200 nm to 300 nm both inclusive.

The oxide semiconductor layer 24 may include, as a principal component, for example, an oxide of one or more of indium (In), gallium (Ga), zinc (Zn), tin (Sn), Al, and Ti. The oxide semiconductor layer 24 is adapted to form a channel between the source/drain electrodes 26A and 26B in accordance with application of the gate voltage. A film thickness of the oxide semiconductor layer 24 may be desirably a value that may cause little deterioration in an ON current of a thin-film transistor, to allow the channel to be influenced by a negative charge to be described later; a specific value may desirably range from 5 nm to 100 nm both inclusive.

The channel protection film 25 may be formed over the oxide semiconductor layer 24, and is adapted to protect the channel from being damaged in forming the source/drain electrodes 26A and 26B. A thickness of the channel protection film 25 may be, for example, 10 nm to 300 nm both inclusive.

The source/drain electrodes 26A and 26B may be, for example, a single-layer film made of one of Mo, Al, copper (Cu), Ti, ITO, TiO, and other materials, or a stacked film made of two or more of them. For example, a three-layer film of Mo, Al, and Mo in this order with respective film thicknesses of 50 nm, 500 nm, and 50 nm, or a metal or a metal compound having weak coupling to oxygen, e.g., a metal compound including oxygen such as ITO and titanium oxide, may be desirably used. This makes it possible to stably maintain electrical characteristics of the oxide semiconductor.

For the planarization layer 27, for example, organic materials such as polyimide and novolac may be used. A thickness of the planarization layer 27 may be, for example, 500 nm to 4000 nm both inclusive, preferably 2000 nm or less. Over the planarization layer 27, an anode electrode 12 of the organic EL element 10 may be formed.

The organic EL element 10 may have a configuration in which, for example, over the planarization layer 27, the anode electrode 12 (a first electrode), a lyophilic layer 13, a liquid-repellent layer (a partition wall) 14, an organic layer 15 and a cathode electrode 16 (a second electrode) may be stacked in this order. The organic EL element 10 may be a display element of a top surface emission type (a top emission type) in which holes injected from the anode electrode 12 and electrons injected from the cathode electrode 16 may be recombined in the light-emission layer 15C (as described later) to generate emission light, and the emission light may be extracted on the opposite side to the substrate 2 (on the side of the cathode electrode 16). The use of the organic EL element 10 of the top surface emission type leads to an enhanced aperture ratio of a light-emission area of the display device 1. Note that the organic EL element 10 is not limited to the top surface emission type, but may be, for example, a display element of a transparent type, that is, a bottom surface emission type (a bottom emission type) in which the light is extracted on the substrate 2.

The anode electrode 12 may be made of a highly reflective material such as Al, Ti, and Cr when the display device 1 is, for example, of the top surface emission type. Moreover, when the display device 1 is of the transparent type, a transparent material such as ITO, IZO, and IGZO may be used for the anode electrode 12.

The lyophilic layer 13 may constitute the first lyophilic parts 3B and the second lyophilic parts 4B illustrated in FIG. 1, and may be made of $SiO_2$, $Si_3N_4$, or other materials as mentioned above. The lyophilic layer 13 may cover an upper surface of the planarization layer 27, and an end of an upper surface and a side surface of the anode electrode 12. The lyophilic layer 13 may include an aperture 13A that faces the anode electrode 12; the aperture 13A may serve as a light-emission region of the organic EL element 10.

The liquid-repellent layer 14 may constitute the first liquid-repellent parts 3A, the second liquid-repellent parts 4A, and the third liquid-repellent parts 4C illustrated in FIG. 1, and may be made of organic materials such as polyimide and novolac as mentioned above; liquid-repellency may be imparted by, for example, plasma treatment. Moreover, the liquid-repellent layer 14 is adapted to ensure insulation between the anode electrode 12 and the cathode electrode 16, and may serve as a partition wall in general. The liquid-repellent layer 14 may be provided in a partial region of the lyophilic layer 13. Specifically, the liquid-repellent layer 14 may be provided on both sides of the aperture 13A, i.e., the light-emission region, of the lyophilic layer 13. Moreover, the liquid-repellent layer 14 may be provided on a contact section between the source/drain electrode 26A and 26B of the TFT 20 and the anode electrode 12.

The organic layer 15 may have a configuration in which, for example, as illustrated in FIG. 3, a hole injection layer 15A, a hole transport layer 15B, the light-emission layer 15C (a red light-emission layer 15CR, a green light-emission layer 15CG and a blue light-emission layer 15CB), an electron transport layer 15D, and an electron injection layer 15E are sequentially stacked from the anode electrode 12 side. An upper surface of the organic layer 15 may be covered with the cathode electrode 16. The red light-emission layer 15CR is adapted to produce red light LR. The green light-emission layer 15CG is adapted to produce green light LG. The blue light-emission layer 15CB is adapted to produce blue light LB.

Alternatively, the organic layer 15 may have a configuration in which, for example, as illustrated in FIG. 4, the hole injection layer 15A, the hole transport layer 15B, the light-emission layer 15C (a yellow light-emission layer 15CY and the blue light-emission layer 15CB), the electron transport layer 15D, and the electron injection layer 15E are sequentially stacked from the anode electrode 12 side. In this case, the yellow light-emission layer 15CY is adapted to produce yellow light LY. The yellow light LY may be color-separated to the red light LR and the green light LG by a color filter CF (a red filter CFR and a green filter CFG).

In the organic layer 15, the hole injection layer 15A, the hole transport layer 15B, the electron transport layer 15D, and the electron injection layer 15E may be formed, by, for example, vacuum vapor deposition, as common layers over an entire surface of the pixel region 3. Meanwhile, the red light-emission layer 15CR, the green light-emission layer 15CG, and the yellow light-emission layer 15CY may be formed for each color by, for example, a coating method. The blue light-emission layer 15CB may be formed by, for example, vacuum vapor deposition, as a common layer over the entire surface of the pixel region 3, or may be formed for each color by, for example, a coating method.

A film thickness and a constituent material of each layer that constitutes the organic layer 15 is not limited in particular; examples may be as follows.

The hole injection layer 15A is adapted to enhance hole injection efficiency into the light-emission layer 15C, and may serve as a buffer layer that prevents leaks. A thickness of the hole injection layer 15A may be preferably, for example, 5 nm to 200 nm both inclusive, more preferably 8 nm to 150 nm both inclusive. A constituent material of the hole injection layer 15A may be appropriately selected in relation to materials of electrodes and adjacent layers; examples may include polyaniline, polythiophene, polypyrrole, polyphenylene vinylene, polythienylene vinylene, polyquinoline, polyquinoxaline, and their derivatives, conductive polymers such as a polymer that includes an aromatic amine structure in a main chain or a side chain, metal phthalocyanine (such as copper phthalocyanine), and carbon. Specific examples of the conductive polymers may include oligoaniline and polydioxythiophene such as poly (3,4-ethylenedioxythiophene) (PEDOT).

The hole transport layer 15B is adapted to enhance hole transport efficiency to the light-emission layer 15C. A thickness of the hole transport layer 15B may depend on an overall configuration of the element, but may be preferably, for example, 5 nm to 200 nm both inclusive, and more preferably 8 nm to 150 nm both inclusive. As a constituent material of the hole transport layer 15B, light-emission materials that are soluble in organic solvents may be used; examples may include polyvinyl carbazole, polyfluorene, polyaniline, polysilane, and their derivatives, a polysiloxane derivative that includes an aromatic amine in a side chain or in a main chain, polythiophene and its derivative, polypyrrole, and $Alq_3$.

In the light-emission layer 15C, upon application of electric field, hole-electron recombination occurs to produce light-emission. A thickness of the light-emission layer 15C may depend on the overall configuration of the element, but may be preferably, for example, 10 nm to 200 nm both inclusive, and more preferably 20 nm to 150 nm both inclusive. The light emission layer 15C each may have a single-layer or stacked structure.

As a constituent material of the light-emission layer 15C, materials corresponding to their respective light-emission colors may be used; examples may include polyfluorene-based polymer derivatives, (poly)paraphenylene vinylene derivatives, polyphenylene derivatives, polyvinyl carbazole derivatives, polythiophene derivatives, perylene-based pigments, coumarin-based pigments, rhodamine-based pigments, and the above-mentioned polymers doped with organic EL materials. As the materials to be doped, for example, rubrene, perylene, 9,10-diphenylanthracene, tetraphenyl butadiene, nile red, and coumarin 6 may be used. Note that the constituent material of the light-emission layer 15C may be used in mixture of two or more kinds of the above-mentioned materials. Moreover, besides the above-mentioned materials of high molecular weights, materials of low molecular weights may be used in combination. Examples of low molecular materials may include benzine, styrylamine, triphenylamine, porphyrin, triphenylene, azatriphenylene, tetracyanoquinodimethane, triazole, imidazole, oxadiazole, polyaryl alkane, phenylenediamine, arylamine, oxazole, anthracene, fluorenone, hydrazone, stilbene, and their derivatives, and heterocyclic conjugated monomers or oligomers such as polysilane-based compounds, vinylcarbazole-based compounds, thiophene-based compounds, and aniline-based compounds.

As the constituent material of the light-emission layer 15C, besides the above-mentioned materials, materials of high light-emission efficiency may be used as a guest material of light-emission properties; examples may include organic light-emission materials such as a low-molecular fluorescent material, a phosphorescent pigment, and a metal complex.

Note that the light-emission layer 15C may be, for example, a light-emission layer of hole transport properties that may also serve as the above-mentioned hole transport layer 15B, or may be a light-emission layer of electron transport properties that may also serve as the electron transport layer 15D as described later.

The electron transport layer 15D and the electron injection layer 15E are adapted to enhance electron transport efficiency to the light-emission layer 15C. A total film thickness of the electron transport layer 15D and the electron injection layer 15E may depend on the overall configuration of the element, but may be preferably, for example, 5 nm to 200 nm both inclusive, and more preferably 10 nm to 180 nm both inclusive.

As a material of the electron transport layer 15D, organic materials having high electron transport capability may be preferably used. This leads to enhanced transport efficiency to the light-emission layer 15C, restraining changes in light-emission colors due to intensity of the electric field. Specifically, for example, the use of arylpyridine derivatives, benzimidazole derivatives, and other materials may be preferred. This makes it possible to maintain high electron supply efficiency even at low drive voltages. Examples of a material of the electron injection layer 15E may include an alkali metal, an alkali earth metal, a rare earth metal, and their oxides, composite oxides, fluorides, and carbonates.

The cathode electrode 16 may be, for example, about 10 nm thick, and may be made of a material having good light transparency and a small work function. Moreover, formation of a transparent conductive film with use of oxides also makes it possible to secure light extraction. In this case, ZnO, ITO, IZnO, InSnZnO, and other oxides may be used. Furthermore, the cathode electrode 16 may be a single layer, but, here in this example, may have a configuration in which a first layer 16A, a second layer 16B, and a third layer 16C are sequentially stacked from the anode electrode 12 side.

The first layer 16A may be preferably made of a material having a small work function and good light transparency. Specific examples may include an alkali earth metal such as calcium (Ca) and barium (Ba), an alkali metal such as lithium (Li) and cesium (Cs), indium (In), magnesium (Mg), and silver (Ag). Furthermore, examples may include alkali metal oxides, alkali metal fluorides, alkali earth metal oxides, and alkali earth metal fluorides such as $Li_2O$, $Cs_2CO_3$, $Cs_2SO_4$, MgF, LiF, and $CaF_2$.

The second layer 16B may be made of a material having light transparency and good conductivity such as a thin-film Mg—Ag electrode and a Ca electrode. As the third layer 16C, a transparent lanthanoid-based oxide may be preferably used in order to restrain deterioration of the electrode. This allows for the use as a sealing electrode that makes it possible to extract light through the top-surface. Meanwhile, in the case of the bottom emission type, as the material of the third layer 16C, gold (Au), platinum (Pt), Au—Ge, or other materials may be used.

Note that the first layer 16A, the second layer 16B, and the third layer 16C may be formed by techniques such as vacuum vapor deposition, sputtering, and plasma CVD (Chemical Vapor Deposition). Moreover, in the case in which the organic EL element 10 constitutes the display device 1 whose drive method is the active matrix method, the cathode electrode 16 may be formed as a solid film over the substrate 2, while being insulated from the anode electrode 12 by the liquid-repellent layer 14 (the partition wall) and the organic layer 15, and may serve as a common electrode of the organic EL elements 10.

Also, the cathode electrode 16 may be a mixed layer containing organic light-emitting materials such as an aluminum quinoline complex, a styrylamine derivative, and a phthalocyanine derivative. In this case, an additional layer having light transparency such as Mg—Ag may be further included as the third layer 16C (not illustrated). Moreover, it goes without saying that the cathode electrode 16 is not limited to the above-mentioned stacked structure, but may have any optimum combination or stacked structure in accordance with a configuration of a device to be fabricated. For example, the configuration of the cathode electrode 16 according to the embodiment as described above involves functional separation of each layer of the electrode, i.e., a stacked structure in which an inorganic layer (the first layer 16A) that facilitates electron injection into the organic layer 15, an inorganic layer (the second layer 16B) that constitutes the electrode, and an inorganic layer (the third layer 16C) that protects the electrode are separated. However, the inorganic layer that facilitates electron injection into the organic layer 15 may also serve as the inorganic layer that constitutes the electrode, and these layers may form a single-layer structure.

Furthermore, in a case in which the organic EL element 10 has a cavity structure, the cathode electrode 16 may be preferably made of a semi-transparent semi-reflective material. This causes multiple interference of the emission light between a light reflection surface on the anode electrode 12 side and a light reflection surface on the cathode electrode 16 side, allowing the emission light to be extracted on the cathode electrode 16 side. In this case, an optical distance between the light reflection surface on the anode electrode 12 side and the light reflection surface on the cathode electrode 16 side may be defined by a wavelength of light that ought to be extracted; the film thickness of each layer may be specified to satisfy the optical distance. In such a display element of the top-surface emission type, the positive use of the cavity structure makes it possible to improve light extraction efficiency to the outside and to control a light-emission spectrum.

A protection layer 17 is adapted to prevent water from intruding into the organic layer 15, and may be formed, with use of a material having low permeability and low water permeability, to have a thickness of, for example, 2 μm to 3 μm both inclusive. A material of the protection layer 17 may be either an insulating material or a conductive material. Preferred examples of the insulating material may include inorganic amorphous insulating materials such as amorphous silicon (α-Si), amorphous silicon carbide (α-SiC), amorphous silicon nitride (α-$Si_{1-x}$), and amorphous carbon (α-C). The inorganic amorphous insulating materials, not forming grains, have low water permeability, and make good protection films.

A sealing substrate 18 may be disposed on the cathode electrode 16 side of the organic EL element 10, and is adapted to seal the organic EL element 10 together with an adhesive layer (not illustrated). The sealing substrate 18 may be made of a transparent material with respect to the light produced in the organic EL element 10, e.g., glass. The sealing substrate 18 may be provided with, for example, the color filter and a light-shielding film as a black matrix (neither illustrated), and is adapted to allow for extraction of the light produced in the organic EL element 10, absorption of external light reflected by wirings between the organic EL elements 10, and improvement in contrast.

On the sealing substrate 18, for example, the color filter and the light-shielding film (neither illustrated) may be provided. The color filter may include the red filter, the green filter, and the blue filter (neither illustrated) that are arranged in order. The red filter, the green filter, and the blue filter may be of a rectangular shape, for example, and formed without gaps therebetween. The red filter, the green filter, and the blue filter each may be made of a resin mixed with a pigment; by selection of the pigment, light transmittance may be adjusted to be high in a target wavelength range of red, green, or blue, and to be low in other wavelength ranges.

The light-shielding film may include, for example, a black resin film mixed with a black coloring agent and having an optical density of 1 or more, or a thin-film filter utilizing interference of thin-films. Among these, the use of the black resin film may be preferred because of low-cost and easy formation. The thin-film filter may include, for example, a stack of one or more thin-films made of a metal, a metal nitride, or a metal oxide, and is adapted to attenuate light utilizing interference of the thin-films. A specific example of the thin-film filter may include an alternate stack of Cr and chromium oxide (III) ($Cr_2O_3$).

The display device 1 may be manufactured, for example, as follows. Note that, in the following, as illustrated in FIG. 3, description is given on a case in which the red light-emission layer 15CR, the green light-emission layer 15CG, and the blue light-emission layer 15CB are formed as the light-emission layer 15C.

First, on the substrate 2, the TFT 20, the planarization layer 27, and the anode electrode 12 may be sequentially formed.

Next, the lyophilic layer 13 may be formed; thereby, the first lyophilic parts 3B and the second lyophilic parts 4B may be formed.

Subsequently, the liquid-repellent layer (the partition wall) 14 may be formed; thereby, the first liquid-repellent parts 3A and the second liquid-repellent parts 4A may be formed.

Thereafter, for example, by vacuum vapor deposition, the hole injection layer 15A and the hole transport layer 15B of the organic layer 15 may be formed over the entire surface of the pixel region 3.

After forming the hole transport layer 15B, the red light-emission layer 15CR and the green light-emission layer 15CG may be formed for each color by a coating method such as a droplet discharge method.

First, an organic material that constitutes the red light-emission layer 15CR may be dissolved in an organic solvent to prepare the ink. The ink may be discharged through a plurality of discharge ports provided on a head of a slit coater (or a stripe coater) to be arranged on the pixel columns 5AR that include the pixels 5R. Thereafter, the solvent may be removed by heating to form the red light-emission layer 15CR.

Specifically, the red light-emission layer 15CR may be formed as follows.

First, as illustrated in FIG. 5, the head H of the slit coater may be disposed above the bead formation region 6 of the peripheral region 4. The head H may be provided with the plurality of discharge ports (not illustrated) in accordance with a pitch of the pixels 5 of a same color, i.e., the red pixels 5R here. The ink may be discharged through the discharge ports of the head H to form a bead B so that the head H is in contact with the substrate 2 with the ink in between. Thus, it is possible to uniformize wettability of a surface of the head H.

Next, as illustrated in FIG. 6, scanning may be carried out along the pixel columns 5AR to discharge the ink I on the red pixels 5R of the pixel columns 5AR. At this occasion, as illustrated in FIG. 7, the head H may be moved in a scanning direction S while being kept in contact with the substrate 2 with the ink I in between.

Here, the pixel region 3 includes the first liquid-repellent parts 3A in the inter-column regions between the plurality of pixels 5. The peripheral region 4 includes the second liquid-repellent parts 4A that are continuous with the first liquid-repellent parts 3A. Accordingly, wetting and spreading of the ink I is restrained by the first liquid-repellent parts 3A in the pixel region 3, and by the second liquid-repellent parts 4A in the peripheral region 4, allowing for precise pattern definition of the red light-emission layer 15CR.

Moreover, the first liquid-repellent parts 3A and the second liquid-repellent parts 4A may form the closed frame shape that surrounds one or more columns of the plurality of pixels 5. Accordingly, the wetting and spreading, or any other inconvenience of the ink I may be restrained even in a case with use of the ink I having low viscosity, a small contact angle, and high wettability, allowing for precise formation of the red light-emission layer 15CR.

Furthermore, the peripheral region 4 may include the second lyophilic parts 4B that are surrounded by the second liquid-repellent parts 4A and are continuous with the first lyophilic parts 3B. In the formation of the organic layer 15 by the coating method as described above, it is important to maintain the connection between the ink I and the substrate 2 by means of formation of the bead B. The peripheral region 4 may include the second lyophilic parts 4B, thereby restraining disconnection of the ink I and the substrate 2 due to surface tension of the ink I, liquid-repellency of the substrate 2, or other causes. This makes it possible to easily maintain the connection between the ink I and the substrate 2. Thus, the red light-emission layer 15CR may be precisely formed by coating.

After forming the red light-emission layer 15CR, the green light-emission layer 15CG may be formed by a coating method, in a similar manner to the red light-emission layer 15CR.

Note that, in a method as illustrated in FIG. 4 that involves the use of the yellow light-emission layer 15CY and the color separation with use of the color filter CF, the coating process may be completed solely with the yellow light-emission layer 15CY. This leads to advantages in terms of costs.

After forming the green light-emission layer 15CG, for example, by vacuum vapor deposition, the electron transport layer 15D and the electron injection layer 15E of the organic layer 15, the cathode electrode 16, and the protection layer 17 may be formed over the entire surface of the pixel region 3. Thereafter, the sealing substrate 18 may be bonded with the adhesive layer (not illustrated) in between. Thus, the display device 1 illustrated in FIGS. 1 to 4 may be completed.

As described, in the embodiment, the pixel region 3 includes the first liquid-repellent parts 3A in the inter-column regions between the plurality of pixels 5. The peripheral region 4 includes the second liquid-repellent parts 4A that are continuous with the first liquid-repellent parts 3A. This makes it possible to restrain wetting and spreading of a deposited material by the first liquid-repellent parts 3A in the pixel region 3, and by the second liquid-repellent parts 4A in the peripheral region 4, allowing for highly precise patterning of the organic layer 15. Hence, it is possible to realize a full-color display device having stable characteristics and a simple configuration.

Moreover, the first liquid-repellent parts 3A and the second liquid-repellent parts 4A may form the closed frame shape that surrounds one or more columns of the plurality of pixels 5. This makes it possible to restrain the ink I from wetting and spreading, or causing any other inconvenience even in a case with use of the ink I having low viscosity, a small contact angle, and high wettability. Hence, it is possible to precisely form the organic layer 15.

Furthermore, the peripheral region 4 may include the second lyophilic parts 4B that are surrounded by the second liquid-repellent parts 4A and are continuous with the first lyophilic parts 3B. This makes it possible to enhance the wettability of the bead formation regions 6, and to facilitate the formation of the bead. It is therefore possible to restrain the disconnection of the ink I and the substrate 2 due to the surface tension of the ink I, the liquid-repellency of the substrate 2, or other causes, and to maintain the connection between the ink I and the substrate 2. This allows for stable application of the ink to the first lyophilic parts 3B, making it possible to form the organic layer 15 precisely by coating.

Second Embodiment

FIG. 8 illustrates a plan configuration of a display device 1A according to a second embodiment of the disclosure. The embodiment involves a widened section 7 provided in the second lyophilic parts 4B, thereby enhancing uniformity in film thickness of the organic layer 15 at the start of coating. Otherwise, the display device 1A may have similar configurations, workings, and effects to those of the display device 1 according to the above-described first embodiment, and may be manufactured in a similar manner to the above-described first embodiment. Accordingly, description is given with corresponding components designated by same references.

In the widened section 7, an interval D1 between the second liquid-repellent parts 4A may be larger than an interval D2 between the first liquid-repellent parts 3A. This causes dispersion of the liquid pool in the formation of the beads B, leading to enhanced uniformity in the film thickness of the light-emission layer 15C at the start of coating.

Specifically, as described with reference to FIGS. 5 to 7, in a case of coating of the organic layer 15C by discharging the ink I from the head H, the bead B may be formed so that the head H is in contact with the substrate 2 with the ink I in between. In forming the bead B, the ink I may be discharged in a larger amount than in scanning. Accordingly, the liquid pool in forming the bead B may be pulled by the head H in accordance with progress of the scanning. This causes the film thickness of the light-emission layer 15C to be larger in a part at the start of coating, resulting in occurrence of variation in the film thickness in the scanning direction. The occurrence of the variation in the film thickness may contribute to variation in characteristics of the elements that may cause unevenness of intensity or other defects in light-emission.

In the embodiment, the second lyophilic parts 4B may include the widened section 7. This makes it possible to disperse, in an in-plane direction, the liquid pool in forming the bead B, and to restrain the light-emission layer 15C from being thickened at the start of coating. One plausible measure may be to dispose such a thickened part in the peripheral region 4 to restrain influences on inside of the pixel region 3; however, this case may result in an increase in dimensions of the peripheral region 4. The widened section 7 may be provided in the second lyophilic parts 4B, leading to reduction in a length of the thickened part in the scanning direction. This makes it possible to reduce the dimensions of the peripheral region 4. This also leads to advantages in terms of design of the display device 1A, making it possible to attain enhancement in quality of the product.

A planar shape of the widened section 7 is not limited in particular; but, for example, as illustrated in FIG. 8, the interval D1 of the second liquid-repellent parts 4A may be preferably gradually increased as goes far from the first liquid-repellent parts 3A in a longitudinal direction of the first liquid-repellent parts 3A. One reason for this may be because a liquid amount becomes larger as goes far from the first liquid-repellent parts 3A.

In examples illustrated in FIGS. 8 and 9, the light-emission layer 15C includes the red light-emission layer 15CR, the green light-emission layer 15CG, and the blue light-emission layer 15CB, as described in the first embodiment with reference to FIG. 3. The red light-emission layer 15CR and the green light-emission layer 15CG may be formed for each color by the coating method illustrated in FIGS. 5 to 7. The blue light-emission layer 15CB may be formed by a deposition method over the entire surface of the pixel region 3.

In the example illustrated in FIG. 8, the widened section 7 of the red pixel column 5AR may be located along a same side, e.g., the upper side of the pixel region 3 as the widened section 7 of the green pixel column 5AG. In this case, the red light-emission layer 15CR and the green light-emission layer 15CG may be formed by coating from above downwards. In the blue pixel columns 5AB, the width of the second lyophilic part 4B may be narrowed.

In the example illustrated in FIG. 9, the widened section 7 of the red pixel column 5AR of the red pixels 5R may be located along one of the two opposite sides, e.g., the upper side of the pixel region 3. The widened section 7 of the green pixel column 5AG of the green pixels 5G may be located along another of the two opposite sides, e.g., the lower side of the pixel region 3. In this case, the red light-emission layer 15CR may be formed by coating from above downwards, while the green light-emission layer 15CG may be formed by coating from below upwards. In the pixel column 5AB of the blue pixels 5B, the width of the second lyophilic parts 4B may be narrowed.

In examples illustrated in FIGS. 10 and 11, the yellow light LY from the yellow light-emission layer 15CY may be color-separated by the color filter CF to produce the red light LR and the green light LG, as described in the first embodiment with reference to FIG. 4. The blue light-emission layer 15CB may be formed by a deposition method over the entire surface of the pixel region 3.

In this example, as illustrated in FIG. 10, the first liquid-repellent parts 3A and the second liquid-repellent parts 4A may surround one pixel column 5A (a red/green pixel column 5ARG). In the red/green pixel column 5ARG, the red pixels 5R and the green pixels 5G may be alternately arranged in a line. The red/green pixel column 5ARG may include the yellow light-emission layer 15CY. The yellow light-emission layer 15CY may be formed by coating from above downwards.

Alternatively, as illustrated in FIG. 11, the first liquid-repellent parts 3A and the second liquid-repellent parts 4A may surround two pixel columns 5A, i.e., the red pixel column 5AR and the green pixel column 5AG. The red pixel column 5AR and the green pixel column 5AG may include the yellow light-emission layer 15CY. The yellow light-emission layer 15CY may be formed by coating from above downwards.

As described, in the embodiment, the second lyophilic parts 4B may include the widened section 7. This makes it possible to enhance uniformity in the film thickness of the organic layer 15 at the start of coating, and to restrain variation in intensity to enhance display quality. Hence, it is possible to realize a narrow-framed full-color display device having stable characteristics with a simple configuration.

Third Embodiment

FIG. 12 illustrates a plan configuration of a display device 1B according to a third embodiment of the disclosure. The embodiment involves a recess 8 provided in the second lyophilic parts 4B, leading to enhancement in the uniformity of the film thickness of the organic layer 15 at the start of coating. Otherwise, the display device 1B may have similar configurations, workings, and effects to those of the display device 1 according to the above-described first embodiment, and may be manufactured in a similar manner to the above-described first embodiment. Accordingly, description is given with corresponding components designated by same references.

As illustrated in FIG. 13, the recess 8 may include a bottom surface 8A whose level is lower than a level of an upper surface of the first lyophilic parts 3B, and is adapted to disperse the liquid pool in forming the bead B, leading to enhanced uniformity in the film thickness of the light-emission layer 15C at the start of coating. Specifically, the second lyophilic parts 4B may include the recess 8, making it possible to disperse, in a depthwise direction, the liquid pool in forming the bead B. Hence, it is possible to restrain the light-emission layer 15C from being thickened at the start of coating.

Note that the recess 8 as described may be formed by forming a recess in the planarization layer 27 illustrated in FIG. 2. Alternatively, as illustrated in FIG. 14, in the second lyophilic parts 4B, a film 8B may be formed with a thickness smaller than that of the anode electrode 12 or the lyophilic layer 13 illustrated in FIG. 2. The film 8B may be made of a same material as the anode electrode 12 or the lyophilic layer 13. In terms of a manufacture process, the former may be easier.

A depth of the recess 8 is not limited in particular. For example, as illustrated in FIG. 13, the depth may be same over an entirety of the recess 8; or the depth may be partially varied.

As described, in the embodiment, the second lyophilic parts 4B may include the recess 8, making it possible to enhance uniformity in the film thickness of the organic layer 15 at the start of coating, and to restrain variation in intensity or other defects to enhance display quality. Hence, it is possible to realize a narrow-framed full-color display device having stable characteristics with a simple configuration.

Fourth Embodiment

FIG. 15 illustrates a plan configuration of a display device 1C according to a fourth embodiment of the disclosure. The embodiment involves the widened section 7 and the recess 8 provided in the second lyophilic parts 4B, leading to enhancement in the uniformity of the film thickness of the organic layer 15 at the start of coating. Otherwise, the display device 1C may have similar configurations, workings, and effects to those of the display devices 1, 1A, and 1B according to the above-described first to third embodiments, and may be manufactured in a similar manner to the above-described first embodiment. Accordingly, description is given with corresponding components designated by same references.

FIG. 16 illustrates a result of an experiment in which the display device 1C as illustrated in FIG. 15 was actually fabricated and examination was carried out about variation in the film thickness in the scanning direction S. Note that FIG. 16 also illustrates, as a reference example, a similar experimental result in the display device 1 illustrated in FIG. 1. A position of zero along a horizontal axis may correspond to a border line between the bead formation region 6 and the pixel region 3.

As seen from FIG. 16, in the embodiment (FIG. 15) with the widened section 7 and the recess 8 provided in the second lyophilic parts 4B, in the part at the start of coating, a part whose film thickness is 10% or more of a film thickness of a part formed during coating extended by approximately 2 mm from the border line between the bead formation region 6 and the pixel region 3. Meanwhile, in the reference example (the first embodiment, FIG. 1), in the part at the start of the coating, the part whose film thickness is 10% or more of the film thickness of the part formed during coating extended by approximately 12 mm from the border line between the bead formation region 6 and the pixel region 3. One possible reason for this may be as follows; in the reference example (the first embodiment, FIG. 1), the second lyophilic parts 4B did not include the widened section 7 and the recess 8. Thus, it was found that the second lyophilic parts 4B included the widened section 7 and the recess 8, making it possible to further enhance the uniformity in the film thickness of the organic layer 15 at the start of coating.

Fifth Embodiment

FIG. 17 illustrates a plan configuration of a display device 1D according to a fifth embodiment of the disclosure. The embodiment involves a trench 4D that is provided in the peripheral region 4 and surrounds the second liquid-repellent parts 4A and the third liquid-repellent parts 4C, allowing for highly precise patterning. Otherwise, the display device 1D may have similar configurations, workings, and effects to those of the display device 1 according to the above-described first embodiment, and may be manufactured in a similar manner to the above-described first embodiment. Accordingly, description is given with corresponding components designated by same references.

The trench 4D is adapted to restrain the organic layer 15 from being deposited on a wiring section or other sections provided in the peripheral region 4, and may be provided in a shape of a rectangular frame that surrounds the pixel region 3. By providing the trench 4D, the deposited material may be restrained from spreading outward beyond the second liquid-repellent parts 4A and the third liquid-repellent parts 4C. Hence, it is possible to restrain a liquid of an organic deposited material from flowing, in the scanning direction S or in a direction perpendicular to the scanning direction S, into the wiring section or other sections provided in the peripheral region 4. The trench 4D may be configured of, for example, a trench provided in the planarization layer 27.

FIG. 18 illustrates, in an enlarged manner, a part of the peripheral region 4. The peripheral region 4 may be provided with a sealing section 4E. The sealing section 4E may be provided in a shape of a rectangular frame that surrounds the pixel region 3. Outside of the sealing section 4E, there may be provided a terminal 4F extended from the pixel region 3 for external connection. The trench 4D may be provided in a region 4G between the sealing section 4E and the pixel region 3. Furthermore, it may be more preferred that the trench 4D be provided between the sealing section 4E, and the second liquid-repellent parts 4A and the third liquid-repellent parts 4C.

The trench 4D in the embodiment may be effective, not only in the case of coating of the red light-emission layer 15CR, the green light-emission layer 15CG, and the yellow light-emission layer 15CY for each color by a coating method, but also in a case of formation of the hole injection layer 15A, the hole transport layer 15B, the electron transport layer 15D, and the electron injection layer 15E over the entire surface of the pixel region 3.

(Overall Configuration of Display Device)

FIG. 19 schematically illustrates an overall configuration of the display devices 1, and 1A to 1D (hereinafter collectively referred to as the display device 1) as described in the forgoing example embodiments. In the display device 1, the pixel region 3 and the peripheral region 4 as described may be disposed on the substrate 2. In the peripheral region 4, for example, a signal line driver circuit 120 and a scan line driver circuit 130 as drivers for picture display may be provided. In the pixel region 3, a pixel driver circuit 140 may be provided.

FIG. 20 illustrates one example of the pixel driver circuit 140. The pixel driver circuit 140 may be an active-type drive circuit formed below the anode electrode 12 (the first electrode). Specifically, the pixel drive circuit 140 may include a drive transistor Tr1 and a write transistor Tr2, a capacitor (a retention capacitor) Cs between the transistors Tr1 and Tr2, the red organic EL element 10R (or the green organic EL element 10G or the blue organic EL element 10B) coupled in series to the drive transistor Tr1 between a first power line (Vcc) and a second power line (GND). The drive transistor Tr1 and the write transistor Tr2 may be configured of a general thin-film transistor (TFT), and their configurations are not limited in particular; either an inverted staggered structure (a so-called bottom gate type) or a staggered structure (a top gate type) may be possible.

In the pixel drive circuit 140, a plurality of signal lines 120A may be arranged in a column direction, while a plurality of scan lines 130A may be arranged in a row direction. An intersection of each signal line 120A and each scan line 130A may correspond to either one of the red organic EL elements 10R, the green organic EL elements 10G and the blue organic EL elements 10B. Each signal line 120A may be coupled to the signal line driver circuit 120; from the signal line driver circuit 120, an image signal may be supplied to a source electrode of the write transistor Tr2 through the signal line 120A. Each scan line 130A may be coupled to the scan line driver circuit 130; from the scan line driver circuit 130, a scan signal may be sequentially supplied to a gate electrode of the write transistor Tr2 through the scan line 130A.

In the display device 1, each of the organic EL elements 10 may be supplied with the scan signal from the scan line driver circuit 130 through the gate electrode of the write transistor Tr2, while the image signal from the signal line driver circuit 120 may be retained by the retention capacitor Cs through the write transistor Tr2. In other words, the drive transistor Tr1 may be ON/OFF controlled in accordance with the signal retained by the retention capacitor Cs, allowing a drive current Id to be injected into the organic EL element 10 to cause the hole-electron recombination, following which light-emission occurs. The light may pass through the anode electrode 12 and the substrate 2 in the case of the bottom-surface emission (the bottom emission), or may pass through the cathode electrode 16, the color filter (not illustrated), and the sealing substrate 18 in the case of the top-surface emission (the top emission), and may be extracted to the outside.

APPLICATION EXAMPLES

In the following, description is given on application examples of the display device according to the above-described example embodiments with reference to FIGS. 21 to 34. The display device according to the above-described example embodiments may be applied to an electronic apparatus in various fields, for example, a television set, a digital camera, a notebook personal computer, a mobile terminal device such as a mobile phone and a smart phone or a video camera. In other words, the display device may be applied to an electronic apparatus in various fields that is configured to display an image or a picture based on a picture signal input from outside or generated inside.

(Module)

The display device according to the above-described example embodiments may be incorporated, in a form of a module as illustrated in FIG. 21, in an electronic apparatus such as application examples 1 to 9, which are exemplified in the followings. The module includes, for example, on the substrate 2, the pixel region 3 and the peripheral region 4 around the pixel region 3, where external connection terminals (not illustrated) are formed by extension of wirings. On the external connection terminals, a flexible printed circuit (FPC) 9 for signal input and output may be provided.

Application Example 1

FIGS. 22 and 23 illustrate an appearance configuration of an electronic book 210. The electronic book 210 may include, for example, a display section 211 and a non-display section 212, and an operation section 213. Note that the operation section 213 may be provided either on a front face of the non-display section 212 as illustrated in FIG. 22, or on an upper face of the non-display section 212 as illustrated in FIG. 23. The display section 211 is configured of the electronic device (the display device) 2. Note that the electronic device (the display device) 2 may be mounted on a personal digital assistant (PDA) having a similar configuration to that of the electronic book as illustrated in FIGS. 22 and 23.

Application Example 2

FIGS. 24 and 25 illustrate an appearance of a smart phone 220. The smart phone 220 may include, for example, a display section 221 and an operation section 222 on front side, and a camera 223 on back side. The display section 221 is configured of the electronic device (the display device) 2.

Application Example 3

FIG. 26 illustrates an appearance of a television set 230 to which the display device according to the above-described example embodiments is applied. The television set 230 may include, for example, a picture display screen section 233 that includes a front panel 231 and a filter glass 232. The picture display screen section 233 is configured of the electronic device (the display device) 2.

Application Example 4

FIG. 27 illustrates an appearance of a tablet personal computer 240. The tablet personal computer 240 may include, for example, a touch panel section 241 and a casing 242. The touch panel section 241 is configured of the electronic device (the display device) 2.

Application Example 5

FIGS. 28 and 29 illustrate an appearance of a digital still camera 250. The digital still camera 250 may include, for example, a lighting section for flash lighting 251, a display section 252, a menu switch 253, and a shutter button 254. The display section 252 is configured of the electronic device (the display device) 2.

Application Example 6

FIG. 30 illustrates an appearance of a notebook personal computer 260. The notebook personal computer 260 may include, for example, a main body 261, a keyboard 262 for input operations of characters and the like, and a display section 263 for image display. The display section 263 is configured of the electronic device (the display device) 2.

Application Example 7

FIG. 31 illustrates an appearance of a video camera 270. The video camera 270 may include, for example, a main body 271, a lens 272 for photographing an object, which is provided on a front side face of the main body 271, a start/stop switch 273 in photographing, and a display section 274. The display section 274 is configured of the electronic device (the display device) 2.

Application Example 8

FIGS. 32 and 33 illustrate an appearance of another electronic book 280. The electronic book 280 is a thin flexible display formed of a component of a soft material. In the electronic book 280, the whole device is configured to be closed (folded) or opened as if an actual book manufactured by binding a plurality of sheets of paper. This allows a user to view contents displayed on the electronic book 280 (for example, pages of a book, and so on), giving the user a sensation of actual book reading.

The electronic book 280 may include, on a support substrate 281, a display section 282. The electronic book 280 may also include a hinge section 283 at a back portion (a back 283A) of a book. On lower-surface side (a surface on the outside when closed) of the electronic book 280, provided is a cover 284 made of a soft resin film. Upper-surface side (a surface on the inside when closed) is covered with a protective sheet 285 made of a resin film that is soft and transparent to display light. The display section 282 is configured of the electronic device (the display device) 2.

Application Example 9

FIGS. 34 and 35 illustrate an appearance of a mobile phone 290. The mobile phone 290 may have a configuration, for example, in which an upper casing 291 and a lower casing 292 are linked by a connection section (a hinge section) 293, and includes a display 294, a sub-display 295, a picture light 296, and a camera 297. The display 294 or the sub-display 295 is configured of the electronic device (the display device) 2.

Although description has been made by giving the example embodiments as mentioned above, the contents of the technology are not limited to the above-mentioned example embodiments and may be modified in a variety of ways.

For example, in the above-described example embodiments, description has been given on specific configurations of the display devices 1, and 1A to 1D. However, the display devices 1, and 1A to 1D are not limited to display devices including all the components as illustrated. Moreover, some components may be substituted by other components.

Moreover, a material and a thickness, or a deposition method or deposition conditions of each layer as described in the above-mentioned example embodiments are not limited to as exemplified above, but other materials and other thicknesses, or other deposition methods or other deposition conditions may be adopted. For example, in the above-described example embodiments, an oxide semiconductor may be used as the channel of the TFT 20. However, this is non-limiting; silicon or organic semiconductors may be also used. Moreover, in the above-described example embodiments, the first liquid-repellent parts 3A and the second liquid-repellent parts 4A that may also serve as the liquid-repellent layer 14 (the partition wall) may be formed with use of the organic materials such as polyimide and novolac. However, this is non-limiting; fluorine-containing materials may be also possible.

Furthermore, besides vacuum vapor deposition and the coating method such as the discharge coating method, the organic layer 15 may be also formed by other coating methods such as a dipping method, a doctor blade method, a spin coating method, and a spray coating method, or by printing method such as an inkjet method, an off-set printing method, a letterpress printing method, an intaglio printing method, a screen printing method, and a micro gravure coating method. Depending on properties of each layer or each member of the organic layer 15, a dry process and a wet process may be used in combination.

In addition, in the above-described example embodiments, as illustrated in FIG. 3, description is given on the case in which the red light-emission layer 15CR, the green light-emission layer 15CG, and the blue light-emission layer 15CB may be formed for each color by, for example, a coating method to obtain the red light LR, the green light LG, and the blue light LB. Alternatively, as illustrated in FIG. 4, description is given on the case in which the yellow light-emission layer 15CY and the blue light-emission layer 15CB may be formed for each color by, for example, a coating method to obtain the red light LR, the green light LG, and the blue light LB with use of the color filter CF. However, the disclosure may be applied to an organic EL element 10 that produces white light-emission. For example, a red light-emission material, a green light-emission material, and a blue light-emission material may be mixed into a host material to prepare a mixed solution; the mixed solution may be applied in a solid state to form a coating film; then, by means of spontaneous multilayering, a white light-emission layer that has a stacked structure of the red light-emission layer 15CR, the blue light-emission layer 15CB, and the green light-emission layer 15CG may be formed.

The disclosure may be applied to formation of wiring patterns, as well as the formation of the light-emission layer 15C of the organic EL display device as described in the example embodiments.

It is to be noted that the contents of the technology may have the following configurations.

(1)
A display device, including:
a pixel region that includes a plurality of pixels arranged in a matrix; and
a peripheral region outside of the pixel region,
wherein the pixel region includes first liquid-repellent parts in inter-column regions between the plurality of pixels, and
the peripheral region includes second liquid-repellent parts that are continuous with the first liquid-repellent parts.

(2)
The display device according to (1),
wherein the first liquid-repellent parts and the second liquid-repellent parts form a closed frame shape that surrounds one or more columns of the plurality of pixels.

(3)
The display device according to (1) or (2),
wherein the pixel region includes first lyophilic parts in inter-row regions and the inter-column regions between the plurality of pixels, the first lyophilic parts being surrounded by the first liquid-repellent parts, and
the peripheral region includes second lyophilic parts that are surrounded by the second liquid-repellent parts and are continuous with the first lyophilic parts.

(4)
The display device according to (3),
wherein the second lyophilic parts include a recess, and the recess includes a bottom surface whose level is lower than a level of an upper surface of the first lyophilic parts.

(5)
The display device according to (3) or (4),
wherein the second lyophilic parts include a widened section in which an interval between the second liquid-repellent parts is larger than an interval between the first liquid-repellent parts.

(6)
The display device according to (5),
wherein, in the widened section, the interval between the second liquid-repellent parts is gradually increased as goes far from the first liquid-repellent parts in a longitudinal direction of the first liquid-repellent parts.

(7)
The display device according to (5) or (6),
wherein the plurality of pixels include a first-color pixel column and a second-color pixel column, and
the widened section inside the first liquid-repellent parts and the second liquid-repellent parts that surround the first-color pixel column is located along a same side of the pixel region as the widened section inside the first liquid-repellent parts and the second liquid-repellent parts that surround the second-color pixel column.

(8)
The display device according to (5) or (6),
wherein the plurality of pixels include a first-color pixel column and a second-color pixel column,
the widened section inside the first liquid-repellent parts and the second liquid-repellent parts that surround the first-color pixel column is located along one of two opposite sides of the pixel region, and
the widened section inside the first liquid-repellent parts and the second liquid-repellent parts that surround the second-color pixel column is located along another of the two opposite sides of the pixel region.

(9)
The display device according to any one of (1) to (8),
wherein the peripheral region includes third liquid-repellent parts outside of pixel columns located at both ends in a row direction of the plurality of pixels.

(10)
The display device according to (9),
wherein the peripheral region includes a trench that surrounds the second liquid-repellent parts and the third liquid-repellent parts.

(11)
The display device according to (10),
wherein the peripheral region includes a sealing section, and
the trench is provided in a region between the sealing section and the pixel region.

(12)
A display device, including:
a pixel region that includes a plurality of pixels arranged in a matrix; and
a peripheral region outside of the pixel region,
wherein the peripheral region includes third liquid-repellent parts outside of pixel columns located at both ends in a row direction of the plurality of pixels.

(13)
A display device, including:
a pixel region that includes a plurality of pixels arranged in a matrix; and
a peripheral region outside of the pixel region,
wherein the pixel region includes first liquid-repellent parts in inter-column regions between the plurality of pixels, and
the peripheral region includes
second liquid-repellent parts that are continuous with the first liquid-repellent parts,
third liquid-repellent parts provided outside of pixel columns located at both ends in a row direction of the plurality of pixels, and
a trench that surrounds the second liquid-repellent parts and the third liquid-repellent parts.

(14)
The display device according to (13),
wherein the peripheral region includes a sealing section, and
the trench is provided in a region between the sealing section and the pixel region.

(15)
An electronic apparatus provided with a display device, the display device including:
a pixel region that includes a plurality of pixels arranged in a matrix; and
a peripheral region outside of the pixel region,
wherein the pixel region includes first liquid-repellent parts in inter-column regions between the plurality of pixels, and
the peripheral region includes second liquid-repellent parts that are continuous with the first liquid-repellent parts.

(16)
An electronic apparatus provided with a display device, the display device including:
a pixel region that includes a plurality of pixels arranged in a matrix; and
a peripheral region outside of the pixel region, wherein the peripheral region includes third liquid-repellent parts outside of pixel columns located at both ends in a row direction of the plurality of pixels.

(17) An electronic apparatus provided with a display device, the display device including:
a pixel region that includes a plurality of pixels arranged in a matrix; and
a peripheral region outside of the pixel region,
wherein the pixel region includes first liquid-repellent parts in inter-column regions between the plurality of pixels, and
the peripheral region includes
second liquid-repellent parts that are continuous with the first liquid-repellent parts,
third liquid-repellent parts provided outside of pixel columns located at both ends in a row direction of the plurality of pixels, and
a trench that surrounds the second liquid-repellent parts and the third liquid-repellent parts.

This application claims the benefit of Japanese Priority Patent Application JP 2013-195769 filed on Sep. 20, 2013 the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is:

1. A display device, comprising:
a pixel region that includes a plurality of pixels arranged in a matrix; and
a peripheral region outside of the pixel region,
wherein the pixel region includes first liquid-repellent parts in inter-column regions between the plurality of pixels, and
the peripheral region includes second liquid-repellent parts that are continuous with the first liquid-repellent parts.

2. The display device according to claim 1,
wherein the first liquid-repellent parts and the second liquid-repellent parts form a closed frame shape that surrounds one or more columns of the plurality of pixels.

3. The display device according to claim 1,
wherein the pixel region includes first lyophilic parts in inter-row regions and the inter-column regions between the plurality of pixels, the first lyophilic parts being surrounded by the first liquid-repellent parts, and
the peripheral region includes second lyophilic parts that are surrounded by the second liquid-repellent parts and are continuous with the first lyophilic parts.

4. The display device according to claim 3,
wherein the second lyophilic parts include a recess, and the recess includes a bottom surface whose level is lower than a level of an upper surface of the first lyophilic parts.

5. The display device according to claim 3,
wherein the second lyophilic parts include a widened section in which an interval between the second liquid-repellent parts is larger than an interval between the first liquid-repellent parts.

6. The display device according to claim 5,
wherein, in the widened section, the interval between the second liquid-repellent parts is gradually increased as goes far from the first liquid-repellent parts in a longitudinal direction of the first liquid-repellent parts.

7. The display device according to claim 5,
wherein the plurality of pixels include a first-color pixel column and a second-color pixel column, and
the widened section inside the first liquid-repellent parts and the second liquid-repellent parts that surround the first-color pixel column is located along a same side of the pixel region as the widened section inside the first liquid-repellent parts and the second liquid-repellent parts that surround the second-color pixel column.

8. The display device according to claim 5,
wherein the plurality of pixels include a first-color pixel column and a second-color pixel column,
the widened section inside the first liquid-repellent parts and the second liquid-repellent parts that surround the first-color pixel column is located along one of two opposite sides of the pixel region, and
the widened section inside the first liquid-repellent parts and the second liquid-repellent parts that surround the second-color pixel column is located along another of the two opposite sides of the pixel region.

9. The display device according to claim 1,
wherein the peripheral region includes third liquid-repellent parts outside of pixel columns located at both ends in a row direction of the plurality of pixels.

10. The display device according to claim 9,
wherein the peripheral region includes a trench that surrounds the second liquid-repellent parts and the third liquid-repellent parts.

11. The display device according to claim 10,
wherein the peripheral region includes a sealing section, and
the trench is provided in a region between the sealing section and the pixel region.

12. The display device according to claim 1, wherein the peripheral region includes a bead formation region provided on at least one of an upper side of the pixel region and a lower side of the pixel region, the bead formation region extending in a longitudinal direction of a row of the pixels.

13. The display device according to claim 12, wherein the bead formation region includes second lyophilic parts that are surrounded by the second liquid-repellent parts.

14. The display device according to claim 12, further comprising a bead of ink formed on and extending from first lyophilic parts of the pixel region to the second lyophilic parts of the peripheral region, the first lyophilic parts provided in inter-row regions and inter-column regions between the plurality of pixels.

15. An electronic apparatus provided with a display device, the display device comprising:
a pixel region that includes a plurality of pixels arranged in a matrix; and
a peripheral region outside of the pixel region,
wherein the pixel region includes first liquid-repellent parts in inter-column regions between the plurality of pixels, and the peripheral region includes second liquid-repellent parts that are continuous with the first liquid-repellent parts.

\* \* \* \* \*